(12) United States Patent
Won et al.

(10) Patent No.: US 11,805,608 B2
(45) Date of Patent: Oct. 31, 2023

(54) BENDABLE DISPLAY APPARATUS

(71) Applicant: SAMSUNG DISPLAY CO., LTD., Yongin-si (KR)

(72) Inventors: Byeonghee Won, Yongin-si (KR); Hayun Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 38 days.

(21) Appl. No.: 17/534,800

(22) Filed: Nov. 24, 2021

(65) Prior Publication Data

US 2022/0346248 A1    Oct. 27, 2022

(30) Foreign Application Priority Data

Apr. 27, 2021  (KR) .................. 10-2021-0054636

(51) Int. Cl.
| | | |
|---|---|---|
| *H05K 5/00* | (2006.01) | |
| *H05K 5/02* | (2006.01) | |
| *H10K 50/84* | (2023.01) | |
| *H10K 59/12* | (2023.01) | |
| *H10K 77/10* | (2023.01) | |
| *H10K 102/00* | (2023.01) | |

(52) U.S. Cl.
CPC ......... *H05K 5/0217* (2013.01); *H05K 5/0017* (2013.01); *H10K 50/84* (2023.02); *H10K 59/12* (2023.02); *H10K 77/111* (2023.02); *H10K 2102/311* (2023.02)

(58) Field of Classification Search
CPC .......................... H05K 5/0217; H05K 5/0017
USPC ........................................................ 361/807
See application file for complete search history.

(56) References Cited

U.S. PATENT DOCUMENTS

| | | | |
|---|---|---|---|
| 9,891,442 B2 | 2/2018 | Gu et al. | |
| 10,917,985 B1* | 2/2021 | Lee .................. | H05K 5/0017 |
| 2018/0024593 A1* | 1/2018 | Seo .................. | G06F 1/1681 |
| | | | 361/679.21 |
| 2020/0035061 A1* | 1/2020 | Froy ................. | G07F 17/3213 |
| 2020/0073443 A1* | 3/2020 | Seo .................. | G06F 1/3262 |
| 2020/0409418 A1 | 12/2020 | Yoo et al. | |

FOREIGN PATENT DOCUMENTS

| | | |
|---|---|---|
| KR | 1020150049822 A | 5/2015 |
| KR | 1020160020039 A | 2/2016 |
| KR | 20170052348 A | 5/2017 |
| KR | 1020210001447 A | 1/2021 |

* cited by examiner

*Primary Examiner* — Hung S. Bui
(74) *Attorney, Agent, or Firm* — CANTOR COLBURN LLP

(57) ABSTRACT

A display apparatus includes: a display panel including a first edge extending in a first direction and a second edge extending in a second direction intersecting with the first direction; a frame extending in one of the first direction and the second direction and located behind the display panel; a plurality of supporters located between the display panel and the frame, where each of the plurality of supporters extends in the first direction; and a connector connecting adjacent supporters among the plurality of supporters.

18 Claims, 38 Drawing Sheets

BENDABLE DISPLAY APPARATUS

This application claims priority to Korean Patent Application No. 10-2021-0054636, filed on Apr. 27, 2021, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

A display apparatus may provide an image to a user by using a display panel. When the display apparatus is a curved TV, the display apparatus may provide an image to a user through a display panel that is concavely curved so that a distance from the user's eyes to the center and opposite sides of a screen is constant. In this case, a three-dimensional effect of the image may increase. Accordingly, the immersion of the user who watches the image may increase, and the user's eye fatigue may decrease.

However, the curved TV may take a lot of space, and a user may sense screen distortion according to a location where the user watches the curved TV. Also, when a plurality of users watch the curved TV, different users other than a user who is located at the center of curvature of the curved TV may sense screen distortion.

SUMMARY

One or more embodiments include a display apparatus in which damage to a display panel is prevented or reduced and also the display panel is bent into various shapes.

Additional aspects will be set forth in part in the description which follows and, in part, will be apparent from the description, or may be learned by practice of the presented embodiments of the disclosure.

According to one or more embodiments, a display apparatus includes: a display panel including a first edge extending in a first direction and a second edge extending in a second direction intersecting the first direction; a frame extending in one of the first direction and the second direction and located behind the display panel; a plurality of supporters located between the display panel and the frame, where each of the plurality of supporters extends in the first direction, and a connector connecting adjacent supporters among the plurality of supporters.

The connector may be located between the adjacent supporters and may include a first elastomer.

The display apparatus may further include a cushion layer located between the display panel and the plurality of supporters, and the cushion layer may include a second elastomer.

The first elastomer and the second elastomer may be identical with each other.

The display apparatus may further include a plurality of balls surrounded by the connector and including a third elastomer.

A modulus of the connector may be different from a modulus of the cushion layer.

The connector may connect the adjacent supporters in a bridge shape.

The connector and the adjacent supporters may be integrally provided with each other.

A modulus of the connector may be different from a modulus of one of the plurality of supporters.

The frame may include a first frame extending in the first direction and a second frame extending in the second direction, and the first frame and the second frame may bend the display panel so that each of the first edge and the second edge has a curvature.

The first frame may bend the plurality of supporters, and the second frame may move one of the plurality of supporters in a third direction intersecting the first direction and the second direction.

The display panel may include a center display area and a corner display area located between the center display area and a corner where the first edge and the second edge meet each other. In a bent state of the display panel, the corner display area may be bent from the first direction to a third direction intersecting with the first direction and the second direction and may be bent from the second direction to the third direction.

According to one or more embodiments, a display apparatus includes: a display panel including a first edge extending in a first direction and a second edge extending in a second direction intersecting the first direction; a plurality of supporters located behind the display panel, where each of the plurality of supporters extends in the first direction; a connector located between adjacent supporters among the plurality of supporters and including a first elastomer; and a cushion layer located between the plurality of supporters and the display panel and including a second elastomer.

The first elastomer and the second elastomer may be identical with each other.

The display apparatus may further include a plurality of balls surrounded by the connector and including a third elastomer.

A modulus of the connector may be different from a modulus of the cushion layer.

According to one or more embodiments, a display apparatus includes: a display panel including a first edge extending in a first direction and a second edge extending in a second direction intersecting the first direction; a frame including a first frame located behind the display panel and extending in the first direction and a second frame located behind the display panel and extending in the second direction; a plurality of supporters located between the display panel and the frame, where each of the plurality of supporters extends in the first direction; and a connector connecting adjacent supporters among the plurality of supporters in a bridge shape.

The connector and the adjacent supporters may be integrally provided with each other.

A modulus of the connector may be different from a modulus of one of the plurality of supporters.

The first frame may bend the display panel so that the first edge has a curvature.

The second frame may bend the display panel so that the second edge has a curvature.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
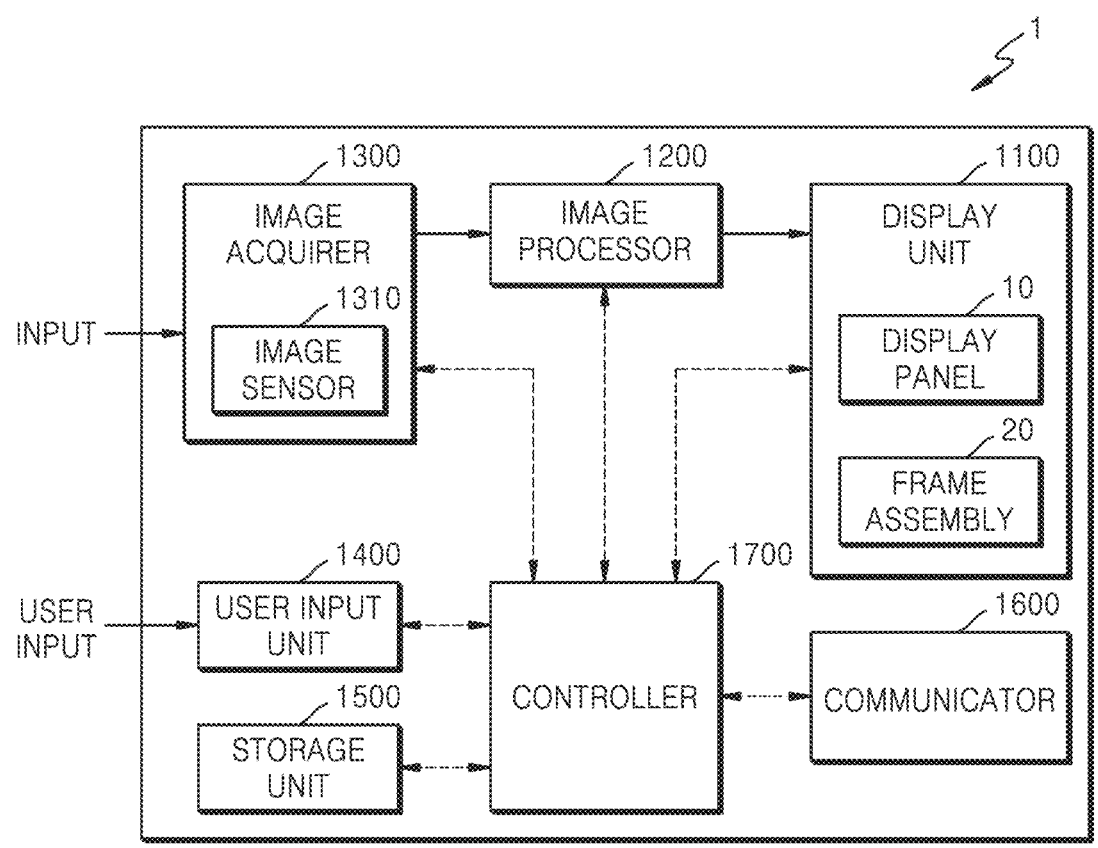
FIG. 1 is a block diagram of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

One or more embodiments of the disclosure will be described below in more detail with reference to the accompanying drawings. Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, embodiments of the disclosure are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled"

to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

A display apparatus displays a moving picture or a still image, and thus may be used as the display screens of various products such as not only portable electronic apparatuses, such as mobile phones, smartphones, tablet personal computers ("PCs"), mobile communication terminals, electronic notebooks, electronic books, portable multimedia players ("PMPs"), navigation devices, and ultra mobile PCs ("UMPCs") but also televisions, notebooks, monitors, advertisement panels, and Internet of things ("IoT") devices. The display apparatus according to an embodiment may also be used in wearable devices such as smart watches, watch phones, glasses-type displays, and head mounted displays ("HMDs"). The display apparatus according to an embodiment may also be used as dashboards of automobiles, center information displays ("CIDs") of the center fascia or dashboards of automobiles, room mirror displays that replace the side mirrors of automobiles, and displays arranged on the rear sides of front seats to serve as entertainment devices for back seat passengers of automobiles.

FIG. 1 is a block diagram of a display apparatus 1 according to an embodiment.

The display apparatus 1 may include a display unit 1100, an image processor 1200, an image acquirer 1300, a user input unit 1400, a storage unit 1500, a communicator 1600, and a controller 1700.

The display unit 1100 may display an image. According to an embodiment, the display unit 1100 may display an image, based on an image signal processed by the image processor 1200. According to an embodiment, the display unit 1100 may display a digital image. The display unit 1100 may include a display panel 10 and a frame assembly 20. The display panel 10 may display an image. The frame assembly 20 may bend the display panel 10. Accordingly, the display panel 10 may be bent into various shapes.

According to an embodiment, the display unit 1100 may display communication interface information supported by the communicator 1600. The controller 1700 may control the display unit 1100 to display the communication interface information stored in the storage unit 1500 to be displayed on the display panel 10.

The image processor 1200 may process an image signal received from the outside. The image processor 1200 may perform preset various image processing operations on the image signal. The image processor 1200 may output an image signal obtained after the image processing operations to the display unit 1100, so that an image is displayed on the display panel 10.

The image processor 1200 may include an image receiver (not shown) that receives an image signal from the outside. The image receiver may be implemented in various ways in accordance with an implementation type of the display apparatus 1 and the standard of the received image signal. For example, the image processor 1200 may wirelessly receive a radio frequency ("RF") signal output from a broadcasting station (not shown), or may receive by wire an image signal based on standards such as composite video, component video, super video, SCART, and high definition multimedia interface ("HDMI"). When an image signal is a broadcast signal, the image processor 1200 may include a tuner that tunes the broadcast signal for each channel.

According to another embodiment, an image signal may be input from an external device. For example, the image signal may be input from an external device such as a PC, an audio/visual ("AV") device, a smartphone, or a smart pad. According to another embodiment, an image signal may be produced from data received through a network such as the Internet. In this case, the display apparatus 1 may perform network communication through the communicator 1600. According to another embodiment, an image signal may be produced from data stored in the storage unit 1500 that is a non-volatile storage unit such as a flash memory or a hard disk. The storage unit 1500 may be provided inside or outside the display apparatus 1. When the storage unit 1500 is provided outside the display apparatus 1, a connector (not shown) to which the storage unit 1500 is connected may be further provided.

A type of an image processing operation performed by the image processor 1200 is not limited. For example, the type of the image processing operation may include at least one of decoding corresponding to various image formats, de-interlacing, frame refresh rate conversion, scaling, noise reduction for improving image quality, detail enhancement, and line scanning. The image processor 1200 may be implemented as a group of individual elements that may independently perform each process, or may be implemented as a system-on-chip ("SoC") where various functions are integrated.

The image acquirer 1300 may obtain an external image by photographing an external environment. The image acquirer 1300 may be an image obtainer. According to an embodiment, the image acquirer 1300 may be implemented as a camera that captures an image of an external environment. In this case, the camera may be installed at a certain position of the display apparatus 1. For example, the camera may be installed on the display apparatus 1, or may be installed inside the display unit 1100. A position of the camera is not limited, and in some cases, the camera may be separated from a main body of the display apparatus 1 and may be installed outside the display apparatus 1.

The image acquirer 1300 may include a lens (not shown) through which an image is transmitted, and an image sensor 1310 that senses the image transmitted through the lens. The image sensor 1310 may be a charge-coupled device ("CCD") image sensor or a complementary metal-oxide-semiconductor ("CMOS") image sensor. An image input through the image acquirer 1300 may be processed by the image processor 1200.

The user input unit 1400 may receive an input of a user. The user input unit 1400 may transmit preset various control commands or unlimited information to the controller 1700, according to a manipulation and an input of the user.

According to an embodiment, the user input unit 1400 may receive an input signal from an input device that is provided in the main body of the display apparatus 1 or is spaced apart from the display apparatus 1. For example, the user input unit 1400 may receive an input signal through a keypad and/or an input panel (not shown) including buttons such as numeric keys and/or menu keys provided on the main body of the display apparatus 1. Alternatively, the user input unit 1400 may receive an input signal through a separate input device such as a remote controller, a keyboard, and/or a mouse which generates at least one of a command, data, information, and a signal preset to remotely control the display apparatus 1 and transmits the at least one of the command, the data, the information, and the signal to the display apparatus 1. The separate input device may be an external device that is connected to the main body of the display apparatus 1 and is capable of performing wireless communication, and examples of the wireless communication may include infrared communication, RF communication, and a wireless local area network ("LAN"). The input device may be manipulated by the user to transmit a preset command to the display apparatus 1. Alternatively, the user input unit 1400 may receive a voice signal of the user.

The storage unit 1500 may store various data. The storage unit 1500 may store unlimited data under the control of the controller 1700. The storage unit 1500 may include at least one of a volatile memory and a non-volatile memory. Examples of the volatile memory may include at least one of dynamic random-access memory ("DRAM") and static RAM ("SRAM"), and examples of the non-volatile memory may include at least one of read-only memory ("ROM"), programmable ROM ("PROM"), electrically programmable ROM ("EPROM"), electrically erasable and programmable ROM ("EEPROM"), a flash memory, phase-change RAM ("PRAM"), magnetic RAM ("MRAM"), resistive RAM ("RRAM"), ferroelectric RAM ("FRAM"), a hard disk drive ("HDD"), and a solid-state drive ("SSD").

The storage unit 1500 may be accessed by the controller 1700, and may perform at least one of a read operation, a write operation, a modify operation, a delete operation, and an update operation with respect to data. Data stored in the storage unit 1500 may include at least one of operating system data for driving the display apparatus 1, various applications executable on an operating system, image data, and additional data.

The storage unit 1500 may store a signal or data input and/or output according to an operation of each element under the control of the controller 1700. The storage unit 1500 may store a control program for controlling the display apparatus 1, a graphical user interface ("GUI") related to an application provided by a manufacturer or downloaded from the outside, images for providing a GUI, user information, documents, databases, or related data.

The communicator 1600 may perform wired and/or wireless communication with an external device. According to an embodiment, the communicator 1600 may support at least one of Wi-Fi, Bluetooth, RF, Zigbee, wireless LAN, infrared communication, ultra-wideband ("UWB"), and near-field communication ("NFC").

The communicator 1600 may be embedded in the main body of the display apparatus 1. According to another embodiment, the communicator 1600 may be implemented as a dongle or a module and may be detachably attached to a connector (not shown) of the display apparatus 1.

The controller 1700 may control the display apparatus 1. The controller 1700 may control an overall operation of the display apparatus 1 and signal flow between internal elements of the display apparatus 1. The controller 1700 may process data. The controller 1700 may control power supply from a power supply unit (not shown) to internal elements. According to an embodiment, when there is an input of the user or a preset and stored condition is satisfied, the controller 1700 may execute an operating system ("OS") and various applications stored in the storage unit 1500.

The controller 1700 may obtain information to bend the display panel 10, and may control the display panel 10 to be bent and display an image by considering the obtained information. According to an embodiment, the controller 1700 may control the frame assembly 20 to bend the display panel 10.

Figure 2:
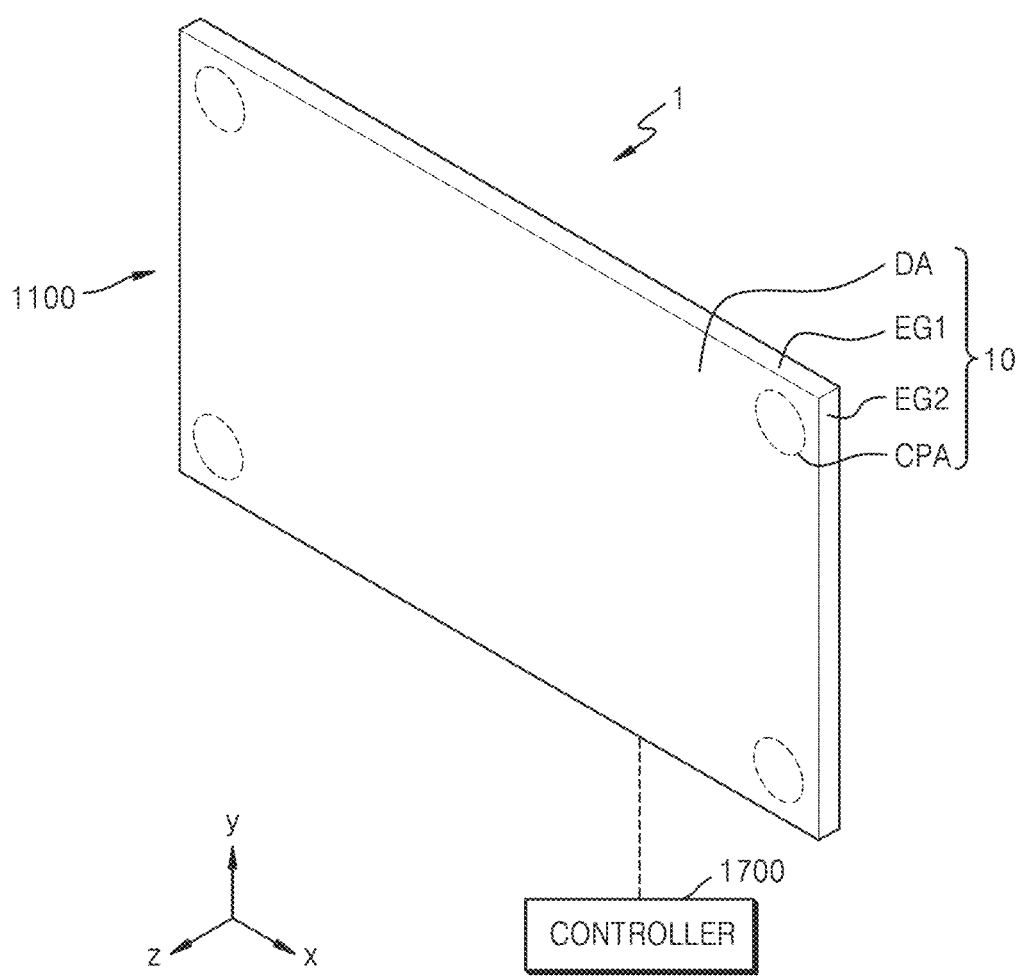
FIG. 2 is a schematic perspective view of a display apparatus according to an embodiment.
Figure 3:
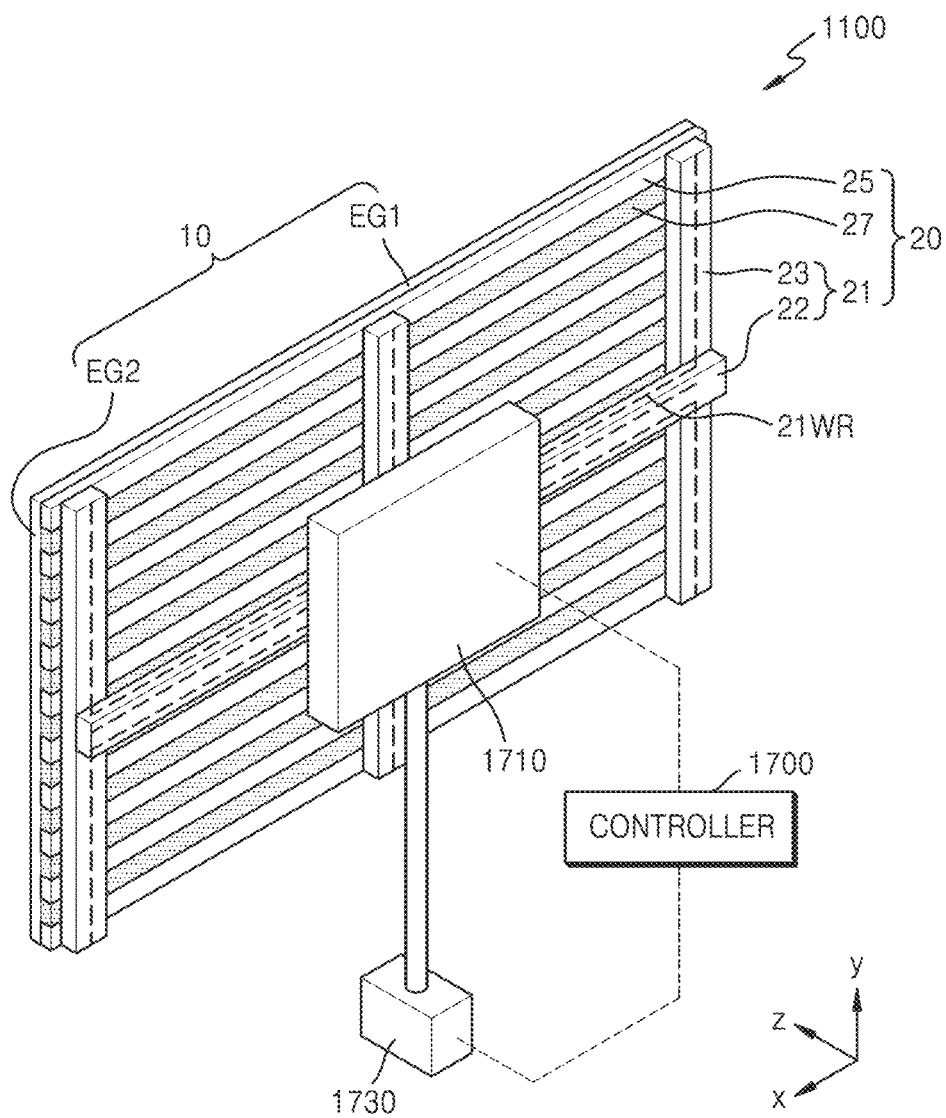
FIG. 3 is a schematic perspective view of a display apparatus according to an embodiment.

FIG. 2 is a schematic perspective view of the display apparatus 1 according to an embodiment. FIG. 3 is a schematic perspective view of the display apparatus 1 according to an embodiment. FIG. 2 is a perspective view illustrating a front side of the display unit 1100, and FIG. 3 is a perspective view illustrating a rear side of the display unit 1100.

Referring to FIGS. 2 and 3, the display apparatus 1 may include the display unit 1100 and the controller 1700. The display unit 1100 may include the display panel 10 and the frame assembly 20. The display panel 10 may display an image.

The display panel 10 may include edges. The display panel 10 may include a first edge EG1 and a second edge EG2. The first edge EG1 and the second edge EG2 may be ends of the display panel 10. According to an embodiment, the first edge EG1 and the second edge EG2 may meet each other. In this case, the first edge EG1 and the second edge EG2 may intersect each other. Alternatively, the first edge EG1 and the second edge EG2 may meet each other in a curved shape.

The first edge EG1 may extend in a first direction. The second edge EG2 may extend in a second direction. In this case, the first direction and the second direction may intersect each other. For example, the first direction and the second direction may form an acute angle, a right angle, or an obtuse angle. A case where the first direction is an x direction or a −x direction and the second direction is a y direction or a −y direction will now be focused on and described in detail.

The display panel 10 may be bent. According to an embodiment, the display panel 10 may be bent from the first direction (e.g., the x direction or the −x direction) to a third direction. The third direction may provide an acute angle, a right angle, or an obtuse angle with respect to a plane defined by the first direction (e.g., the x direction or the −x direction) and the second direction (e.g., the y direction or the −y direction). According to an embodiment, the third direction may be a z direction or a −z direction. As used herein, when the display panel 10 is "bent from the first direction (e.g., the x direction or the −x direction) to the third direction (e.g., the z direction or the −z direction)", it means that a cross-section of the display panel 10 intersecting with a plane (e.g., an xz plane) defined by the first direction (e.g., the x direction or the −x direction) and the third direction (e.g., the z direction or the −z direction) is bent to be concave or convex.

According to another embodiment, the display panel 10 may be bent from the second direction (e.g., the y direction or the −y direction) to the third direction (e.g., the z direction or the −z direction). As used herein, when the display panel 10 is "bent from the second direction (e.g., the y direction or the −y direction) to the third direction (e.g., the z direction or the −z direction)", it means that a cross-section of the display panel 10 intersecting with a plane (e.g., a yz plane) defined by the second direction (e.g., the y direction or the −y direction) and the third direction (e.g., the z direction or the −z direction) is bent to be concave or convex.

According to another embodiment, the display panel 10 may be bent from the first direction (e.g., the x direction or the −x direction) to the third direction (e.g., the z direction or the −z direction), and may be bent from the second direction (e.g., the y direction or the −y direction) to the third direction (e.g., the z direction or the −z direction). In this case, both the cross-section of the display panel 10 intersecting with the xz plane and the cross-section of the display panel 10 intersecting with the yz plane are bent to be concave or convex. In this case, the display panel 10 may be stretched and/or contracted in the first direction (e.g., the x direction or the −x direction) and/or the second direction (e.g., the y direction or the −y direction). When the display panel 10 is not stretched and/or contracted in the first direction (e.g., the x direction or the −x direction) and/or the second direction (e.g., the y direction or the −y direction), relatively large stress may occur at a corner of the display panel 10 and the display panel 10 may be damaged.

The display panel 10 according to an embodiment may be a stretchable display panel that may be stretched and/or contracted in the first direction (e.g., the x direction or the −x direction) and/or the second direction (e.g., the y direction or the −y direction). Accordingly, in an embodiment of the present invention, even when the display panel 10 is bent in various directions, relatively small stress may be applied to the display panel 10 and damage to the display panel 10 may be effectively prevented or reduced.

The display panel 10 may include a display area DA. The display area DA may display an image. According to an embodiment, the display panel 10 may display an image in the display area DA under the control of the controller 1700.

A pixel may be located in the display area DA. According to an embodiment, a plurality of pixels may be located in the display area DA. The display panel 10 may provide an image by using light emitted from a pixel. According to an embodiment, the pixel may include a display element.

According to an embodiment, the display panel 10 may include a component area CPA. The component area CPA may be an area where a component capable of performing various functions is located. According to an embodiment, the component may include an image acquirer such as a sensor or camera using light. The component area CPA may include a transmissive area through which light of the sensor or light travelling to the camera is transmitted.

The component area CPA may be at least partially surrounded by the display area DA. For example, the component area CPA may be entirely surrounded by the display area DA. Alternatively, only a portion of the component area CPA may be surrounded by the display area DA.

According to an embodiment, a plurality of component areas CPA may be provided. According to an embodiment, the plurality of component areas CPA may be spaced apart from one another in the first direction (e.g., the x direction or the −x direction) and/or the second direction (e.g., the y direction or the −y direction).

The component area CPA may be located offset from the center of the display panel 10 in the first direction (e.g., the x direction or the −x direction) and/or the second direction (e.g., the y direction or the −y direction).

According to an embodiment, the component area CPA may have a circular shape or an elliptical shape on a plane (e.g., a xy plane). According to another embodiment, the component area CPA may have a polygonal shape such as a quadrangular shape on a plane. According to another embodiment, the component area CPA may have a curved shape.

A component (not shown) may overlap the component area CPA in a plan view. In this case, the component may be located inside the display unit 1100. The component may be an electronic element using light or sound. For example, the electronic element may include a sensor that receives and uses light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light.

According to an embodiment, the component area CPA may be entirely a transmissive area. In this case, the component area CPA may not display an image. According to another embodiment, the component area CPA may display an image. In this case, a pixel may be located in at least a portion of the component area CPA, and another portion of the component area CPA, where the pixel is not located, may be a transmissive area.

According to some embodiments, the component area CPA may be omitted. In this case, the component may be located outside the display unit 1100. For example, the component may be attached to the first edge EG1 and/or the second edge EG2.

The frame assembly 20 may bend the display panel 10. The frame assembly 20 may be located behind the display panel 10. In other words, the frame assembly 20 may be located opposite to the display area.

The frame assembly 20 may bend the display panel 10 from the first direction (e.g., the x direction or the −x direction) to the third direction (e.g., the z direction or the −z direction), where the third direction intersects with the first direction (e.g., the x direction or the −x direction) and the second direction (e.g., the y direction or the −y direction). Bending the component from the first direction (e.g., the x direction or the −x direction) to the third direction (e.g., the z direction or the −z direction) means that a cross-section of the component intersecting with a plane (e.g., an xz plane) defined by the first direction (e.g., the x direction or the −x direction) and the third direction (e.g., the z direction or the −z direction) is bent to be concave or convex.

The first edge EG1 of the display panel 10, which is bent, may have a curvature. The first edge EG1 of the display panel 10, which is bent, may be bent from the first direction (e.g., the x direction or the −x direction) to the third direction (e.g., the z direction or the −z direction).

The frame assembly 20 may bend the display panel 10 from the second direction (e.g., the y direction or the −y direction) to the third direction (e.g., the z direction or the −z direction). Bending the component from the second direction (e.g., the y direction or the −y direction) to the third direction (e.g., the z direction or the −z direction) means that a cross-section of the component intersecting with a plane (e.g., a yz plane) defined by the second direction (e.g., the y direction or the −y direction) and the third direction (e.g., the z direction or the −z direction) is bent to be concave or convex.

The second edge EG2 of the display panel 10, which is bent, may have a curvature. The second edge EG2 of the bent display panel 10 may be bent from the second direction (e.g., the y direction or the −y direction) to the third direction (e.g., the z direction or the −z direction).

The frame assembly 20 may bend the display panel 10 from the first direction (e.g., the x direction or the −x direction) to the third direction (e.g., the z direction or the −z direction), and may bend the display panel 10 from the second direction (e.g., the y direction or the −y direction) to the third direction (e.g., the z direction or the −z direction). Accordingly, each of the first edge EG1 and the second edge EG2 of the display panel 10, which is bent, may have a curvature.

The frame assembly 20 may be controlled by the controller 1700. The frame assembly 20 may be controlled by the controller 1700 to be bent from the first direction (e.g., the x direction or the −x direction) to the third direction (e.g., the z direction or the −z direction). The frame assembly 20 may be controlled by the controller 1700 to be bent from the second direction (e.g., the y direction or the −y direction) to the third direction (e.g., the z direction or the −z direction). The frame assembly 20 may include a frame 21, a plurality of supporters 25, and a connector 27.

The frame 21 may bend the display panel 10. The frame 21 may be located behind the display panel 10. According to an embodiment, the frame 21 at the rear of the display panel 10 may bend the display panel 10. The frame 21 may include a wire 21WR therein. The wire 21WR may bend the frame 21. For example, when the wire 21WR is contracted or stretched, or a length of the wire 21WR is reduced or increased by a motor, the frame 21 may be bent.

The frame 21 may include austenitic stainless steel. According to another embodiment, the frame 21 may be formed of or include stainless steel, invar, nickel (Ni), cobalt (Co), a nickel alloy, or a nickel-cobalt alloy. According to another embodiment, the frame 21 may be formed of any of various metal materials. According to another embodiment, the frame 21 may include a high-molecular compound, for example, a polymer.

The frame 21 may extend in the first direction (e.g., the x direction or the −x direction) or the second direction (e.g., the y direction or the −y direction). According to an embodiment, the frame 21 may extend in the first direction (e.g., the x direction or the −x direction). According to another embodiment, the frame 21 may extend in the second direction (e.g., the y direction or the −y direction). According to another embodiment, the frame 21 may include a first frame 22 extending in the first direction (for example, the x direction or the −x direction) and a second frame 23 extending in the second direction (for example, the y direction or the −y direction). The first frame 22 and the second frame 23 may bend the first edge EG1 and the second edge EG2 of the display panel 10 to have respective curvatures, respectively. A case where the frame 21 includes the first frame 22 and the second frame 23 will now be focused on and described in detail.

The first frame 22 may extend in the first direction (e.g., the x direction or the −x direction). In FIG. 3, one first frame 22 is located behind the display panel 10. However, according to another embodiment, a plurality of first frames 22 may be provided behind the display panel 10.

The first frame 22 may be bendable from the first direction (e.g., the x direction or the −x direction) to the third direction (e.g., the z direction or the −z direction). The first frame 22 may be bendable under the control of the controller 1700. Accordingly, the first frame 22 may bend the display panel 10 from the first direction (e.g., the x direction or the −x direction) to the third direction (e.g., the z direction or the −z direction). The first frame 22 may bend the first edge EG1 of the display panel 10 to have a curvature.

According to an embodiment, the first frame 22 may be integrally provided as one first frame in the first direction (e.g., the x direction or the −x direction). According to another embodiment, the first frame 22 may include a plurality of first frame portions spaced apart from one another with the second frame 23 therebetween.

The second frame 23 may extend in the second direction (e.g., they direction or the −y direction). The second frame 23 may be located behind the display panel 10. According to an embodiment, a plurality of second frames 23 may be located behind the display panel 10. According to another embodiment, one second frame 23 may be located behind the display panel 10.

The second frame 23 may be bendable from the second direction (e.g., the y direction or the −y direction) to the third direction (e.g., the z direction or the −z direction). The second frame 23 may be bendable under the control of the controller 1700. Accordingly, the second frame 23 may bend the display panel 10 from the second direction (e.g., the y direction or the −y direction) to the third direction (e.g., the z direction or the −z direction). The second frame 23 may bend the second edge EG2 of the display panel 10 to have a curvature.

The second frame 23 may be integrally provided as one second frame in the second direction (e.g., the y direction or the −y direction). According to another embodiment, the second frame 23 may include a plurality of second frame portions spaced apart from one another with the first frame 22 therebetween.

According to an embodiment, the first frame 22 and the second frame 23 may intersect each other. In this case, the first frame 22 and the second frame 23 may be fixed to each other at intersections between the first frame 22 and the second frame 23.

The plurality of supporters 25 may be located between the display panel 10 and the frame 21. According to an embodiment, the plurality of supporters 25 may be located between the display panel 10 and the first frame 22. According to an embodiment, the plurality of supporters 25 may be located between the display panel 10 and the second frame 23. According to an embodiment, the plurality of supporters 25 may be located behind the display panel 10. The plurality of supporters 25 may support the display panel 10. The display panel 10 may be fixed to the plurality of supporters 25, and the plurality of supporters 25 may be fixed to the frame 21.

The plurality of supporters 25 may maintain a shape of the display panel 10. According to an embodiment, the display panel 10 may be a stretchable display panel. In this case, a shape of the display panel 10 may be changed into various other shapes. Because the plurality of supporters 25 support the display panel 10, the plurality of supporters 25 may maintain a shape of the display panel 10.

The plurality of supporters 25 may each extend in the first direction (e.g., the x direction or the −x direction). For example, the plurality of supporters 25 may be arranged side by side in the second direction (e.g., the y direction or the −y direction).

The plurality of supporters 25 may include austenitic stainless steel. According to another embodiment, the plurality of supporters 25 may be formed of or include stainless steel, invar, nickel (Ni), cobalt (Co), a nickel alloy, or a nickel-cobalt alloy. According to another embodiment, the plurality of supporters 25 may be formed of any of various metal materials. According to another embodiment, the plurality of supporters 25 may include a high-molecular compound, for example, a polymer.

The plurality of supporters 25 may be bendable. According to an embodiment, the first frame 22 may bend the plurality of supporters 25. The plurality of supporters 25 may be bent from the first direction (e.g., the x direction or the −x direction) to the third direction (e.g., the z direction or the −z direction). According to an embodiment, the first frame 22 may bend the plurality of supporters 25 from the first direction (e.g., the x direction or the −x direction) to the third direction (e.g., the z direction or the −z direction). For example, when the first frame 22 is bent from the first direction (e.g., the x direction or the −x direction) to the third direction (e.g., the z direction or the −z direction), the plurality of supporters 25 may also be bent from the first direction (e.g., the x direction or the −x direction) to the third direction (e.g., the z direction or the −z direction). Accordingly, the display panel 10 may be bent from the first direction (e.g., the x direction or the −x direction) to the third direction (e.g., the z direction or the −z direction).

At least one of the plurality of supporters 25 may move in the third direction (e.g., the z direction or the −z direction). For example, the supporter 25 adjacent to the first edge EG1 from among the plurality of supporters 25 may move in the third direction (e.g., the z direction or the −z direction). According to an embodiment, the second frame 23 may move at least one of the plurality of supporters 25 in the third direction (e.g., the z direction or the −z direction). For example, when the second frame 23 is bent from the second direction (e.g., the y direction or the −y direction) to the third direction (e.g., the z direction or the −z direction), at least one of the plurality of supporters 25 (e.g., supporters 25 near the first edge EG1) may move in the third direction (e.g., the z direction or the −z direction). Accordingly, the display panel 10 may be bent from the second direction (e.g., the y direction or the −y direction) to the third direction (e.g., the z direction or the −z direction).

According to an embodiment, the connector 27 may be between adjacent supporters 25. According to an embodiment, a plurality of connectors 27 may be included, and the plurality of connectors 27 may be located between adjacent supporters 25 among the plurality of supporters 25.

The connector 27 may connect the adjacent supporters 25 to each other. The connector 27 may include an elastomer. For example, the connector 27 may include vulcanized natural rubber, synthetic rubber, elastic fiber, foam, a thermoplastic elastomer, or the like. As another example, the connector 27 may include at least one of polyolefine, polyvinyl chloride, elastomeric silicone, elastomeric polyurethane, and elastomeric polyisoprene.

When the plurality of supporters 25 are bent, an interval between adjacent supporters 25 may increase, and a strain acting on the display panel 10 may be locally concentrated. In this case, the display panel 10 may be damaged even when the display panel 10 is a stretchable display panel. According to the present embodiment, the connector 27 may be located between adjacent supporters 25 to connect the adjacent supporters 25 to each other. Accordingly, the connector 27 may prevent or reduce an increase in the interval between adjacent supporters 25 and may effectively prevent or reduce damage to the display panel 10 due to the strain.

The controller 1700 may obtain information to bend the display panel 10, and may bend the display panel 10 by considering the obtained information. The controller 1700 may include a first driver 1710 and a second driver 1730.

The first driver 1710 may control the frame assembly 20. According to an embodiment, the first driver 1710 may control bending of the frame 21. According to an embodiment, the first driver 1710 may include a motor. The motor may contract or stretch the wire 21WR, or may reduce or increase a length of the wire 21WR by winding the wire 21WR.

According to an embodiment, the first driver 1710 may include a plurality of motors. Each of the plurality of motors may control bending of the first frame 22 and the second frame 23. According to an embodiment, the plurality of motors may control bending of one frame 21. For example, when the plurality of motors control the first frame 22, the plurality of motors may independently adjust bending of opposite ends of the first frame 22. As another example, when the plurality of motors control the second frame 23, the plurality of motors may independently adjust bending of opposite ends of the second frame 23. Accordingly, the display panel 10 may be bent into various shapes.

According to an embodiment, the first driver 1710 may be located behind the display unit 1100. In this case, the first driver 1710 may include a fixing member for fixing the display unit 1100 to an external wall surface or the like. For example, the fixing member may include a bracket.

The second driver 1730 may control the display unit 1100 to rotate about the second direction (e.g., the y direction or the −y direction). According to an embodiment, the second driver 1730 may include a motor. The motor may rotate the display unit 1100 about the second direction (e.g., the y direction or the −y direction). Accordingly, the display panel 10 may rotate about the second direction (e.g., the y direction or the −y direction) due to the controller 1700.

Figure 4:
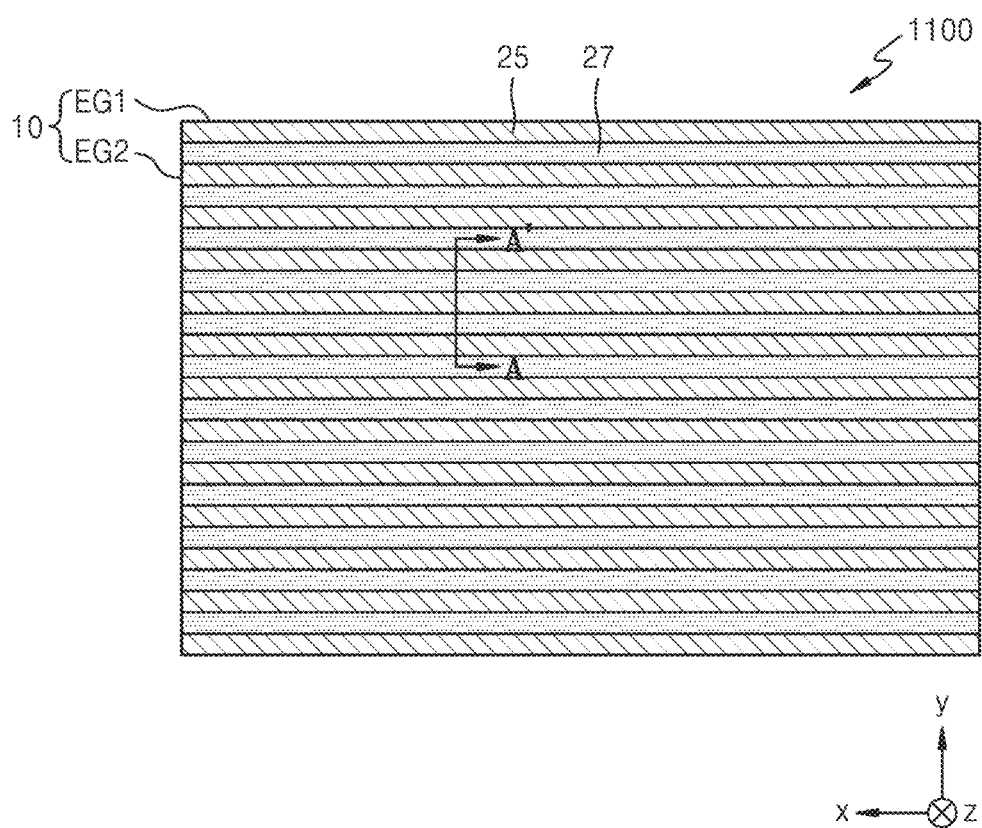
FIG. 4 is a schematic plan view of a display unit according to an embodiment.

FIG. 4 is a schematic plan view of the display unit 1100 according to an embodiment. Reference numerals in FIG. 4 that are the same as the reference numerals in FIG. 3 denote the same elements, and thus repeated descriptions thereof are omitted.

Referring to FIG. 4, the display unit 1100 may include the display panel 10, the plurality of supporters 25, and the connector 27. The display panel 10 may include a first edge EG1 extending in the first direction (for example, the x direction or the −x direction) and a second edge EG2 extending in the second direction (for example, the y direction or the −y direction).

The plurality of supporters 25 may be located behind the display panel 10 (e.g., located in −z direction from the display panel 10). The plurality of supporters 25 may each extend in the first direction (e.g., the x direction or the −x direction). According to an embodiment, the plurality of supporters 25 may be spaced apart from one another in the second direction (e.g., the y direction or the −y direction).

The connector 27 may be between adjacent supporters 25. The connector 27 may connect the adjacent supporters 25 to each other. According to an embodiment, the connector 27 may extend in the first direction (e.g., the x direction or the −x direction). According to an embodiment, a plurality of connectors 27 may be included, and the plurality of connectors 27 may be located between adjacent supporters 25 among the plurality of supporters 25. The plurality of connectors 27 may each extend in the first direction (e.g., the x direction or the −x direction). According to an embodiment, the connector 27 may include an elastomer. Accordingly, the connector 27 may effectively prevent or reduce an increase in the interval between the adjacent supporters 25.

Figure 5A:
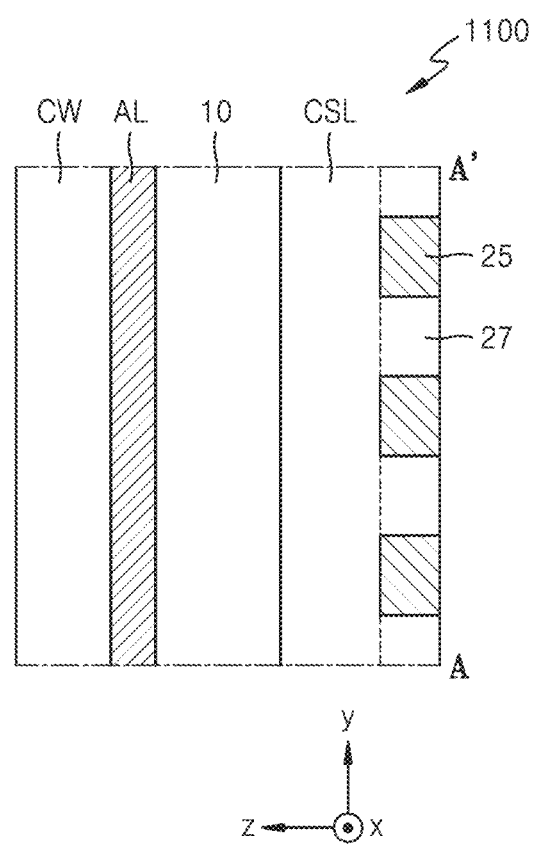
FIG. 5A is a schematic cross-sectional view of the display unit of FIG. 4, taken along line A-A' of FIG. 4.
Figure 5B:
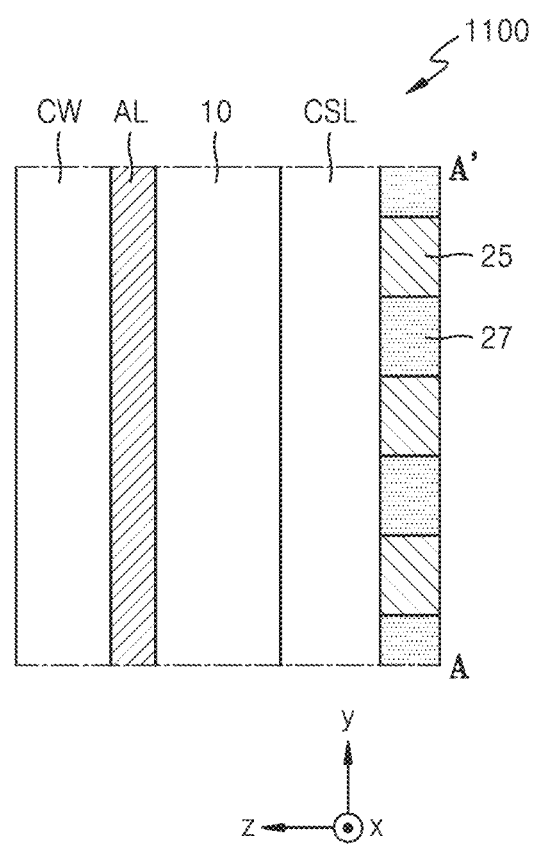
FIG. 5B is a schematic cross-sectional view of the display unit of FIG. 4, taken along line A-A' of FIG. 4 according to another embodiment.

FIG. 5A is a schematic cross-sectional view of the display unit 1100 of FIG. 4, taken along line A-A' of FIG. 4. FIG. 5B is a schematic cross-sectional view of the display unit 1100 of FIG. 4, taken along line A-A' of FIG. 4 according to another embodiment.

Referring to FIGS. 5A and 5B, the display unit 1100 may include the display panel 10, a cover window CW, an adhesive layer AL, the cushion layer CSL, the plurality of supporters 25, and the connector 27.

The cover window CW may be located on the display panel 10. The cover window CW may be a flexible window. The cover window CW may protect the display panel 10 while being easily bent by an external force without generating cracks and the like. According to an embodiment, the cover window CW may be a stretchable cover window that may be stretched and/or contracted.

The cover window CW may include an organic material. For example, the cover window CW may include a urethane-based material. The cover window CW may include polyurethane. The cover window CW may include a high-molecular compound, for example, a polymer.

The adhesive layer AL may be located between the display panel 10 and the cover window CW. The adhesive layer AL may attach the display panel 10 and the cover window CW to each other. According to an embodiment, the adhesive layer AL may include an optically clear adhesive ("OCA").

The cushion layer CSL may be located between the display panel 10 and the plurality of supporters 25. The cushion layer CSL may act as a buffer between the display panel 10 and the plurality of supporters 25. For example, each of the plurality of supporters 25 may move in the third direction (e.g., the z direction or the −z direction) in a transition period between a bent state and a flat state. Distances by which the plurality of supporters 25 move in the third direction (e.g., the z direction or the −z direction) may be different from one another. That is, the distances may be discontinuous. In this case, a position of the cushion layer CSL may be continuously changed even in discontinuous moving distances of the plurality of supporters 25. Accordingly, a position of the display panel 10 may be continuously changed by the cushion layer CSL and the plurality of supporters 25, and the display panel 10 may be bent. Therefore, the cushion layer CSL may effectively prevent or reduce damage to the display panel 10 due to discontinuity of the plurality of supporters 25.

According to an embodiment, the cushion layer CSL may include an elastomer. For example, the connector 27 may include vulcanized natural rubber, synthetic rubber, elastic fiber, foam, a thermoplastic elastomer, or the like. As another example, the cushion layer CSL may include at least one of polyolefine, polyvinyl chloride, elastomeric silicone, elastomeric polyurethane, and elastomeric polyisoprene. According to some embodiments, a first lower adhesive layer may be located between the cushion layer CSL and the display panel 10. According to some embodiments, a second lower adhesive layer may be located between the cushion layer CSL and the plurality of supporters 25. For example, at least one of the first lower adhesive layer and the second lower adhesive layer may include a pressure sensitive adhesive ("PSA").

The connector 27 may be between adjacent supporters 25. The connector 27 may connect the adjacent supporters 25 to each other. According to an embodiment, the connector 27 may fill a space between the adjacent supporters 25. When the plurality of supporters 25 are bent, an interval between adjacent supporters 25 may increase, and strain acting on the display panel 10 may be locally concentrated. In this case, even when the display panel 10 is a stretchable display panel, the display panel 10 may be stretched beyond a stretchable range and may be damaged. The connector 27 may prevent or reduce the increase in the interval between the adjacent supporters 25. Accordingly, the display panel 10 may be stretched only within the stretchable range, and the connector 27 may effectively prevent or reduce damage to the display panel 10.

According to an embodiment, the connector 27 may include a first elastomer. According to an embodiment, the cushion layer CSL may include a second elastomer.

Referring to FIG. 5A, the first elastomer and the second elastomer may be identical with each other. In this case, the connector 27 and the cushion layer CSL may be integrally provided. According to an embodiment, a modulus of the connector 27 may be equal to a modulus of the cushion layer CSL. In other words, the cushion layer CSL may extend between adjacent supporters 25.

Referring to FIG. 5B, the first elastomer and the second elastomer may be different from each other. According to an embodiment, the modulus of the connector 27 may be different from the modulus of the cushion layer CSL. For example, the modulus of the connector 27 may be greater than the modulus of the cushion layer CSL. In this case, the connector 27 may prevent or reduce the increase in the interval between the adjacent supporters 25. The position of the cushion layer CSL may be continuously changed according to discontinuous moving distances of the plurality of supporters 25. Accordingly, a position of the display panel 10 may be continuously changed by the cushion layer CSL and the plurality of supporters 25, and the display panel 10 may be bent.

Figure 6:
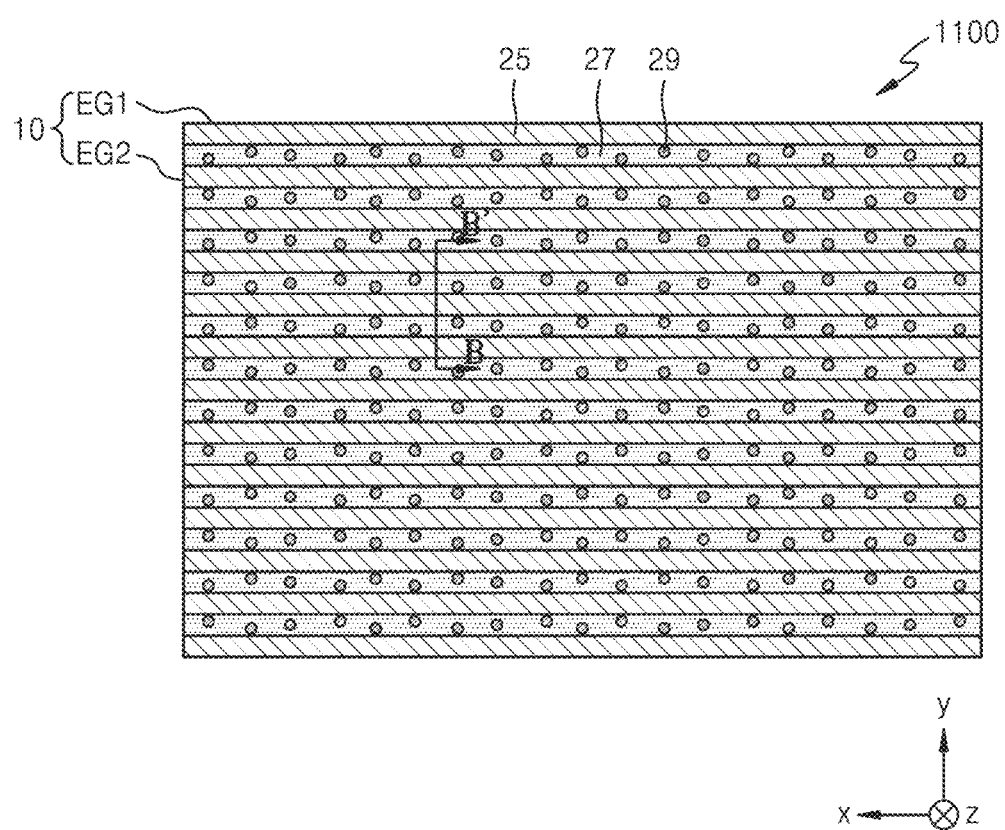
FIG. 6 is a schematic plan view of a display unit according to another embodiment.

FIG. 6 is a schematic plan view of the display unit 1100 according to another embodiment. Reference numerals in FIG. 6 that are the same as the reference numerals in FIG. 4 denote the same elements, and thus repeated descriptions thereof are omitted.

Referring to FIG. 6, the display unit 1100 may include the display panel 10, the plurality of supporters 25, the connector 27, and a plurality of balls 29. The display panel 10 may include the first edge EG1 extending in the first direction (for example, the x direction or the −x direction) and the second edge EG2 extending in the second direction (for example, the y direction or the −y direction).

The plurality of supporters 25 may be located behind the display panel 10. The plurality of supporters 25 may each extend in the first direction (e.g., the x direction or the −x direction). According to an embodiment, the plurality of supporters 25 may be spaced apart from one another in the second direction (e.g., the y direction or the −y direction).

The connector 27 may be between adjacent supporters 25. The connector 27 may connect the adjacent supporters 25 to each other. According to an embodiment, the connector 27 may extend in the first direction (e.g., the x direction or the −x direction). According to an embodiment, a plurality of connectors 27 may be included, and the plurality of connectors 27 may be located between adjacent supporters 25 among the plurality of supporters 25. The plurality of connectors 27 may each extend in the first direction (e.g., the x direction or the −x direction). According to an embodiment, the connector 27 may include an elastomer. Accordingly, the connector 27 may prevent or reduce an increase in the interval between the adjacent supporters 25.

The plurality of balls 29 may be surrounded by the connector 27. The plurality of balls 29 may be between adjacent supporters 25. Each of the plurality of balls 29 may include an elastomer. For example, each of the plurality of balls 29 may include vulcanized natural rubber, synthetic rubber, elastic fiber, foam, a thermoplastic elastomer, or the like. As another example, each of the plurality of balls 29 may include at least one of polyolefine, polyvinyl chloride, elastomeric silicone, elastomeric polyurethane, and elastomeric polyisoprene. According to an embodiment, each of the plurality of balls 29 may include silicone. Alternatively, each of the plurality of balls 29 may include a metal material.

Figure 7:
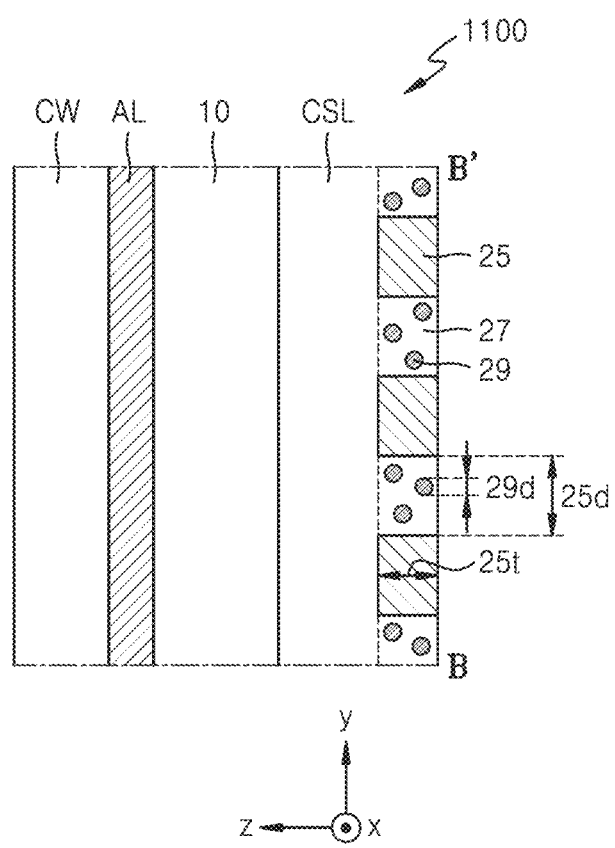
FIG. 7 is a schematic cross-sectional view of the display unit of FIG. 6, taken along line B-B' of FIG. 6.

FIG. 7 is a schematic cross-sectional view of the display unit 1100 of FIG. 6, taken along line B-B' of FIG. 6. Reference numerals in FIG. 7 that are the same as the reference numerals in FIG. 5A denote the same elements, and thus repeated descriptions thereof are omitted.

Referring to FIG. 7, the display unit 1100 may include the display panel 10, the cover window CW, the adhesive layer AL, the cushion layer CSL, the plurality of supporters 25, the connector 27, and the plurality of balls 29.

The plurality of balls 29 may be surrounded by the connector 27. The plurality of balls 29 may be between adjacent supporters 25. According to an embodiment, a diameter 29d of ball 29 may be less than an interval 25d between adjacent supporters 25. According to an embodiment, the diameter 29d of ball 29 may be less than a thickness 25t of supporter 25 in a thickness direction (i.e., third direction). According to an embodiment, the plurality of balls 29 may be arranged between adjacent supporters 25 among the plurality of supporters 25 in a spraying manner, and the connector 27 may coat to surround the plurality of balls 29.

According to an embodiment, the connector 27 may include a first elastomer. The cushion layer CSL may include a second elastomer. The balls 29 may include a third elastomer. According to an embodiment, one of the first elastomer, the second elastomer, and the third elastomer may be the same as another one of the first elastomer, the second elastomer, and the third elastomer. According to another embodiment, one of the first elastomer, the second elastomer, and the third elastomer may be different from another one of the first elastomer, the second elastomer, and the third elastomer.

Figure 8:
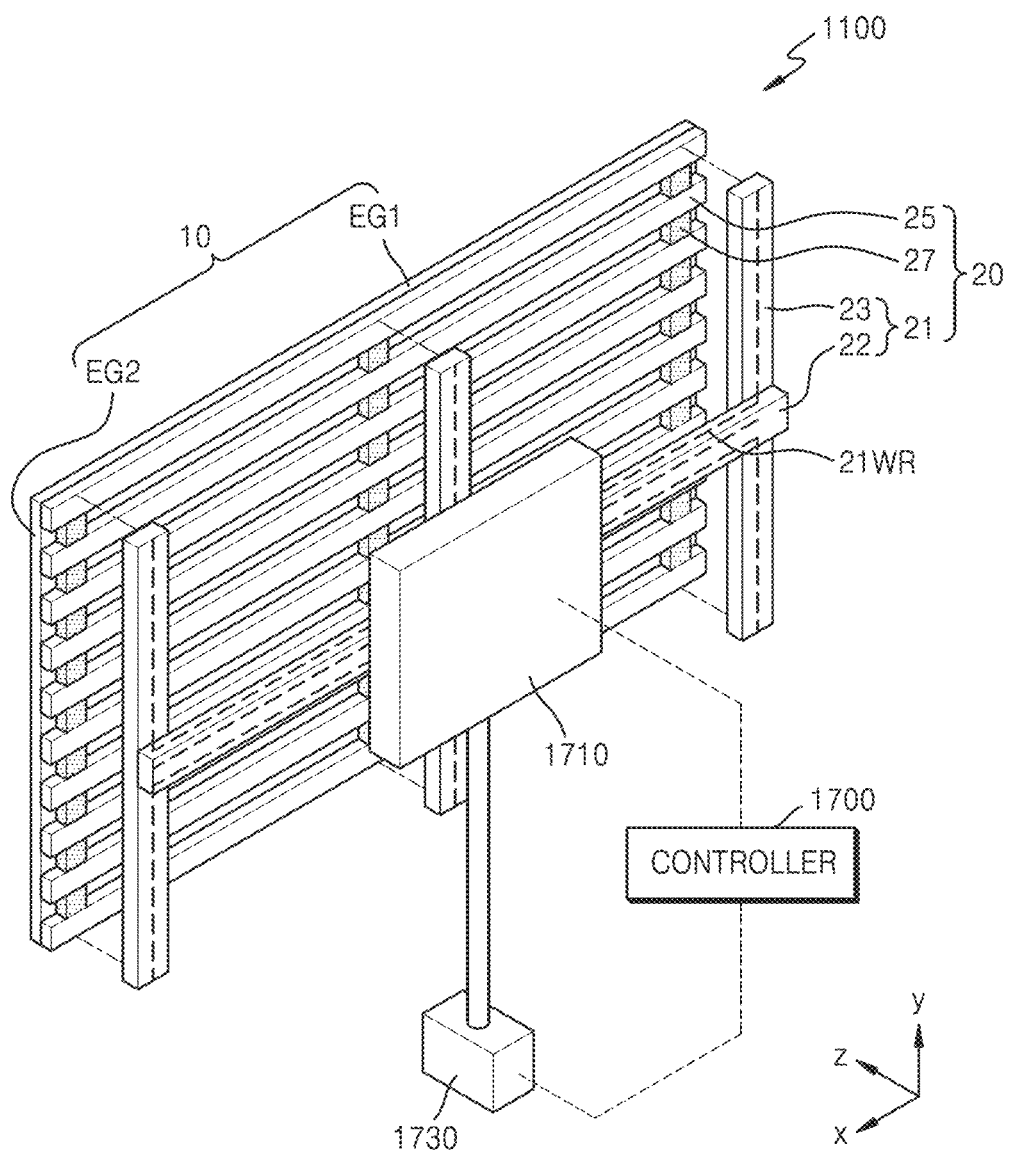
FIG. 8 is a schematic exploded perspective view of a display apparatus according to another embodiment.

FIG. 8 is a schematic exploded perspective view of a display apparatus 1 according to another embodiment. FIG. 8 is an exploded perspective view of a rear side of a display unit 1100 of the display apparatus 1. Reference numerals in FIG. 8 that are the same as the reference numerals in FIG. 3 denote the same elements, and thus repeated descriptions thereof are omitted.

Referring to FIG. 8, the display apparatus 1 may include the display unit 1100 and the controller 1700. The display unit 1100 may include the display panel 10 and the frame assembly 20. The display panel 10 may display an image. The display panel 10 may include a first edge EG1 and a second edge EG2.

The frame assembly 20 may bend the display panel 10. The frame assembly 20 may be located behind the display panel 10. In other words, the frame assembly 20 may be located opposite to the display area DA. The frame assembly 20 may include a frame 21, a plurality of supporters 25, and a connector 27.

The connector 27 may connect the adjacent supporters 25 to each other. According to an embodiment, the connector 27 may connect the adjacent supporters 25 to each other in a bridge shape. In other words, the connector 27 may contact a portion of one of the plurality of supporters 25, and the connector 27 may contact a portion of another one of the plurality of supporters 25. In this embodiment, several, short connectors 27 are used to connect two adjacent supporters 25, compared to the embodiment in FIG. 3 in which one, long connector 27 is used to connect two adjacent supporters 25.

According to an embodiment, the connector 27 may be between adjacent supporters 25. In other words, the connector 27 may be located on the same layer as the layer on which the plurality of supporters 25 are located. According to an embodiment, a plurality of connectors 27 may be included, and the plurality of connectors 27 may be located between adjacent supporters 25 among the plurality of supporters 25. According to another embodiment, the connector 27 may be located on a different layer from the layer on which the plurality of supporters 25 are located. According to an embodiment, the connector 27 may be located behind the plurality of supporters 25. In this case, the connector 27 may be connected to the plurality of supporters 25 via an adhesive. As another example, the connector 27 may be connected to the plurality of supporters 25 by bolt coupling.

The connector 27 may include austenitic stainless steel. According to another embodiment, the connector 27 may be formed of or include stainless steel, invar, nickel (Ni), cobalt (Co), a nickel alloy, or a nickel-cobalt alloy. According to another embodiment, the connector 27 may be formed of any of various metal materials. According to another embodiment, the connector 27 may include a high-molecular compound, for example, a polymer.

According to an embodiment, the connector 27 may be integrally provided with the plurality of supporters 25. In other words, adjacent supporters 25 may be linked to each other. The connector 27 and the plurality of supporters 25 may include the same material. According to another embodiment, the connector 27 and the plurality of supporters 25 may include different materials. A modulus of the connector 27 and a modulus of one of the plurality of supporters 25 may be different from each other.

When the plurality of supporters 25 are bent, an interval between adjacent supporters 25 may increase, and strain acting on the display panel 10 may be locally concentrated. In this case, the display panel 10 may be damaged even when the display panel 10 is a stretchable display panel. According to the present embodiment, the connector 27 may be located between adjacent supporters 25 to connect the adjacent supporters 25 to each other. Accordingly, the connector 27 may prevent or reduce an increase in the interval between adjacent supporters 25 and may effectively prevent or reduce damage to the display panel 10.

FIGS. 9A through 9F are schematic plan views of the display unit 1100, according to various embodiments. Reference numerals in FIGS. 9A through 9F that are the same as the reference numerals in FIG. 4 denote the same elements, and thus repeated descriptions thereof are omitted.

Referring to FIGS. 9A through 9F, the display unit 1100 may include the display panel 10, the plurality of supporters 25, and the connector 27. The display panel 10 may include the first edge EG1 extending in the first direction (for example, the x direction or the −x direction) and the second edge EG2 extending in the second direction (for example, the y direction or the −y direction).

The plurality of supporters 25 may be located behind the display panel 10. The plurality of supporters 25 may each extend in the first direction (e.g., the x direction or the −x direction). According to an embodiment, the plurality of supporters 25 may be spaced apart from one another in the second direction (e.g., the y direction or the −y direction).

The connector 27 may be between adjacent supporters 25. The connector 27 may connect the adjacent supporters 25 to each other. The connector 27 may connect the adjacent supporters 25 to each other in a bridge shape.

According to an embodiment, a width 27w of the connector 27 may be equal to a width 25w of each supporter 25. According to another embodiment, the width 27w of the connector 27 may be different from the width 25w of each supporter 25. The width 27w of the connector 27 may be a length of the connector 27 in the first direction (e.g., the x direction or the −x direction). The width 25w of each supporter 25 may be a length of the supporter 25 in the second direction (e.g., the y direction or the −y direction).

According to an embodiment, the connector 27 may be integrally provided with the plurality of supporters 25. In other words, adjacent supporters 25 may be linked to each other. The connector 27 and the plurality of supporters 25 may include the same material as each other. According to another embodiment, the connector 27 and the plurality of supporters 25 may include different materials from each other. A modulus of the connector 27 and a modulus of one of the plurality of supporters 25 may be different from each other. For example, a modulus of the connector 27 may be less than the modulus of one of the plurality of supporters 25. In this case, when the plurality of supporters 25 are bent, damage to the connector 27 may be effectively prevented or reduced.

Figure 9A:
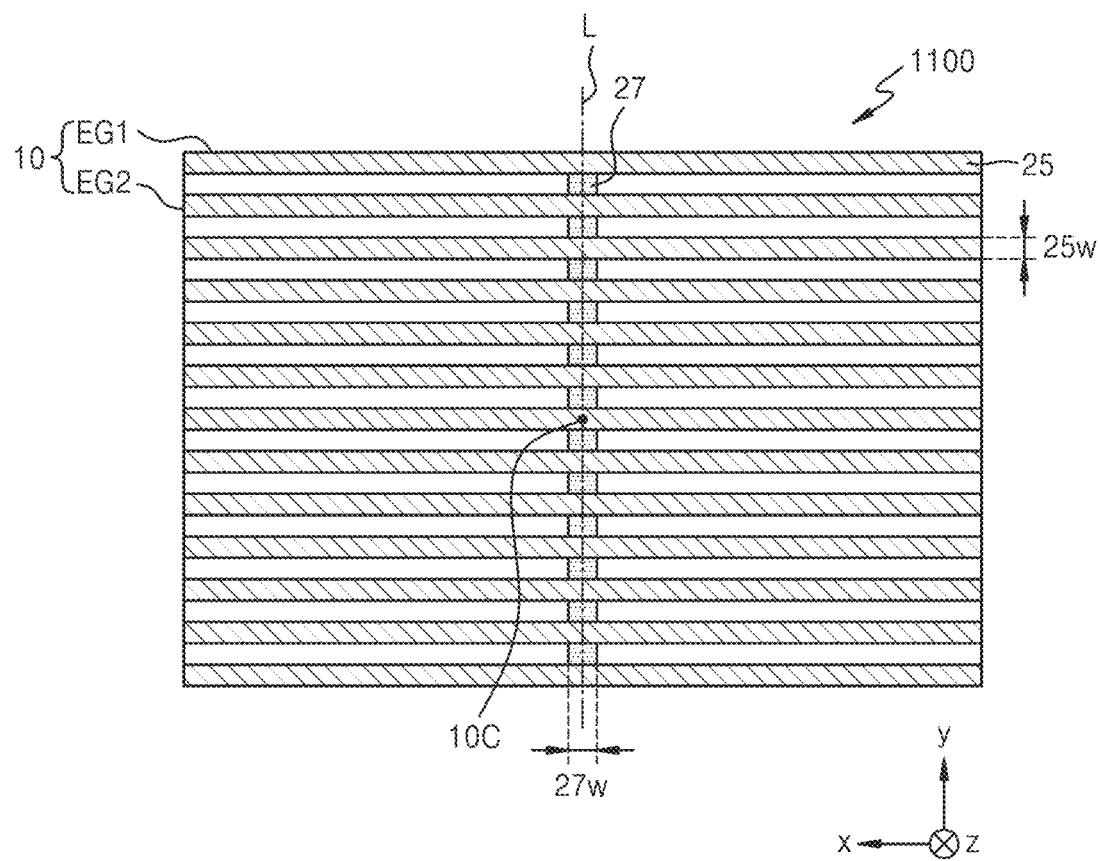
FIGS. 9A through 9F are schematic plan views of a display unit, according to various embodiments.
Figure 9B:
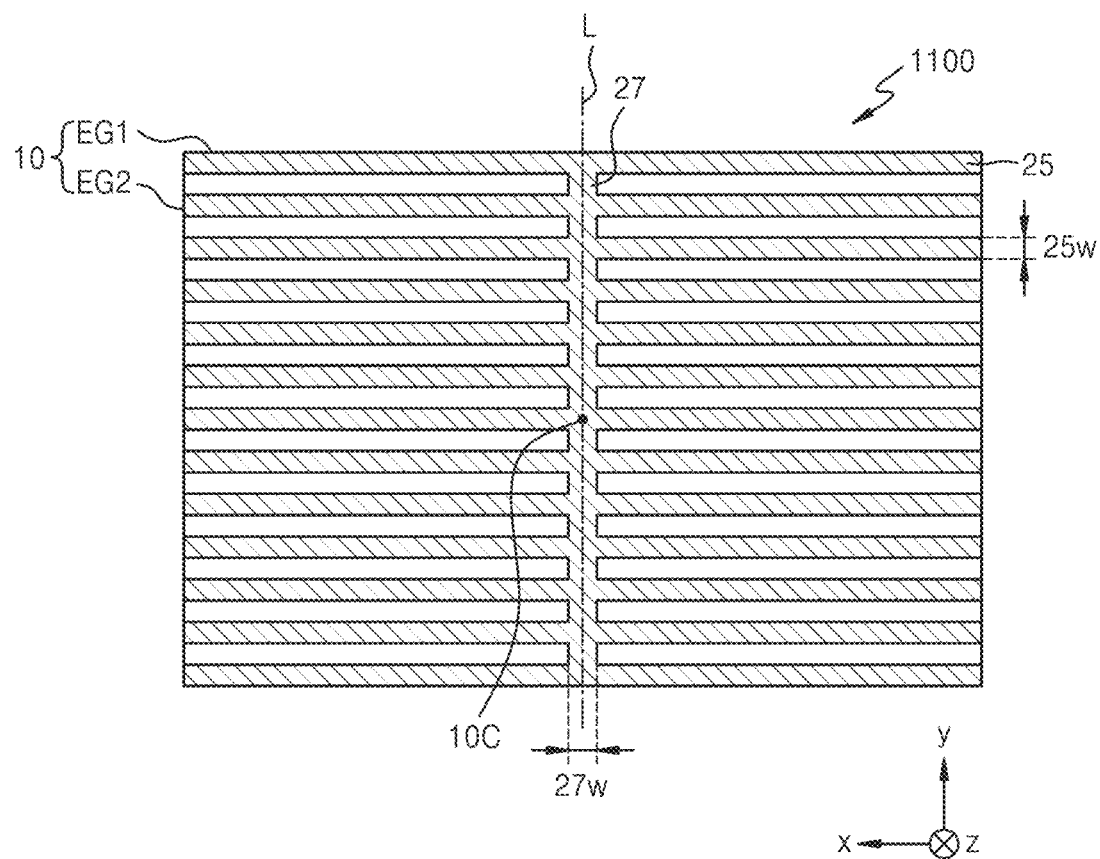

Referring to FIGS. 9A and 9B, a plurality of connectors 27 may be included. The plurality of the connectors 27 may be arranged side by side in the second direction (for example, the y direction or the −y direction). According to an embodiment, a virtual straight line L connecting the plurality of connectors 27 to one another may overlap a center 10C of the display panel 10 in a plan view.

Referring to FIG. 9A, the connector 27 and the plurality of supporters 25 may include different materials. A modulus of the connector 27 and a modulus of one of the plurality of supporters 25 may be different from each other.

Referring to FIG. 9B, the connector 27 may be integrally provided with the plurality of supporters 25. In other words, adjacent supporters 25 may be linked to each other. The connector 27 and the plurality of supporters 25 may include the same material.

Figure 9C:
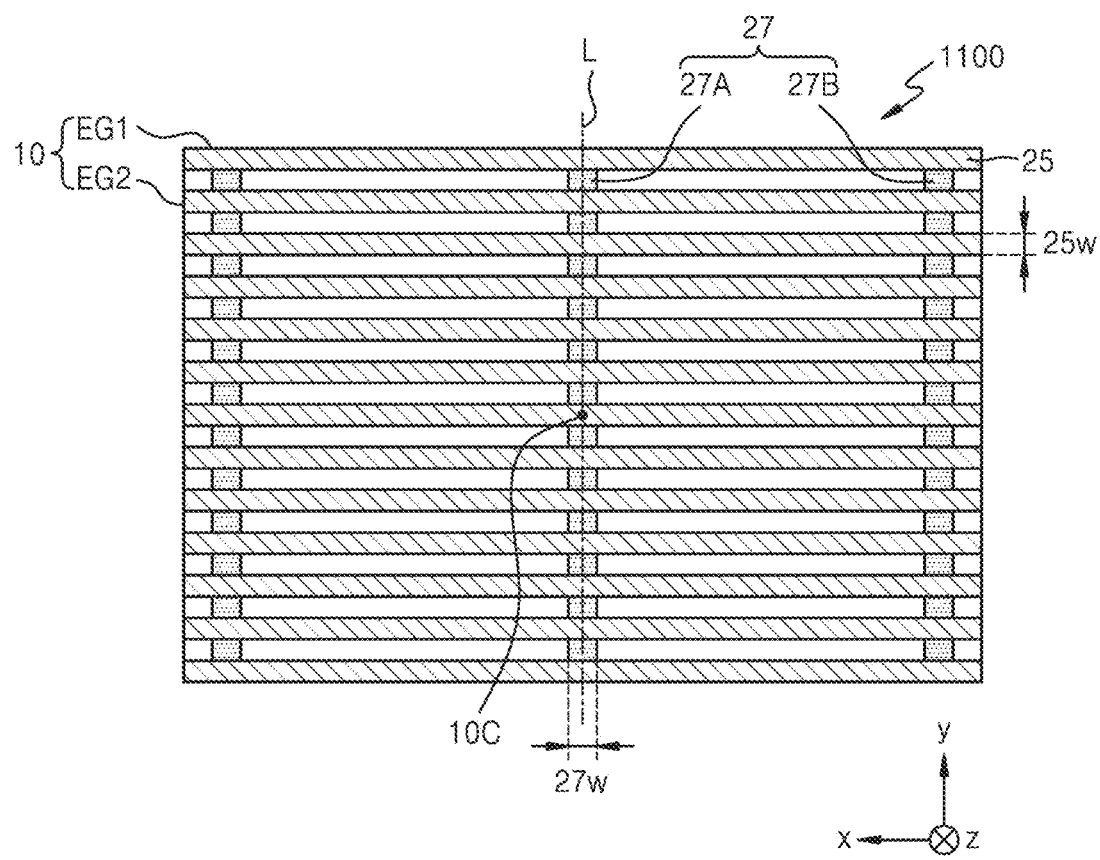
Figure 9D:
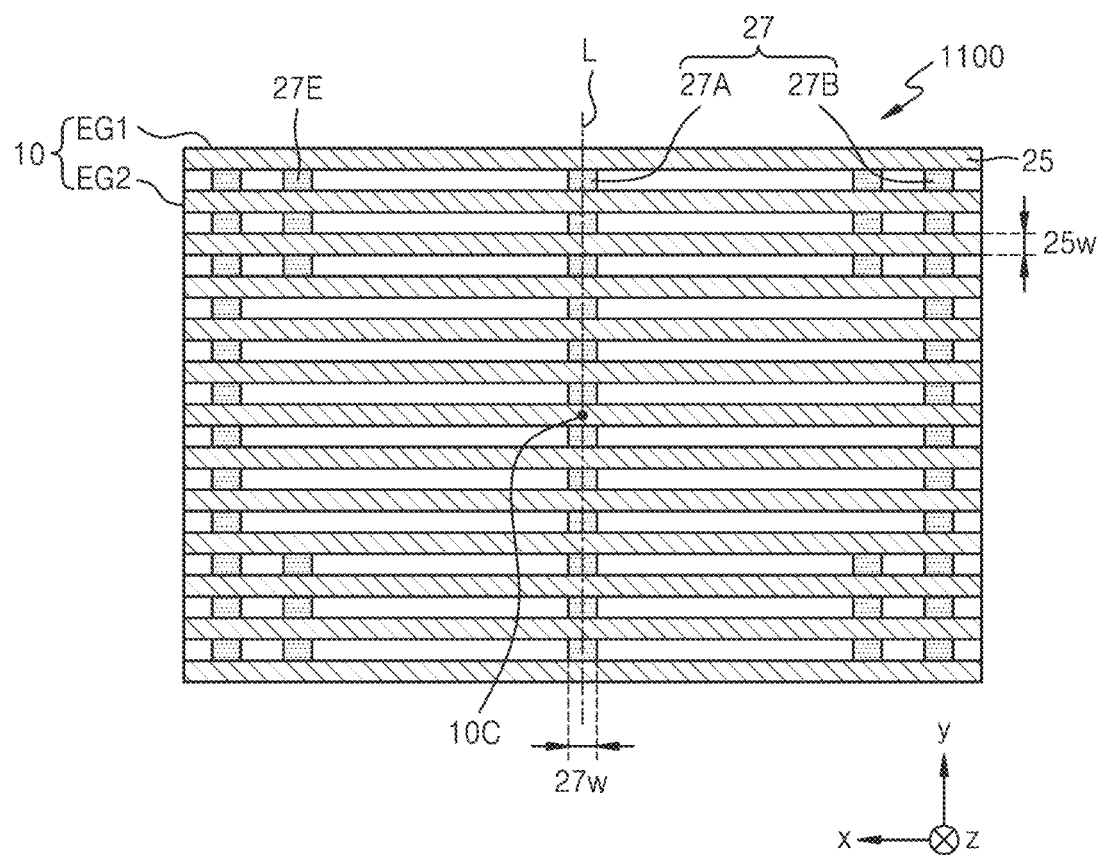

Referring to FIGS. 9C and 9D, a plurality of connectors 27 may be included. The plurality of connectors 27 may include a first connector 27A and a second connector 27B. A plurality of first connectors 27A may be included, and the plurality of first connectors 27A may be arranged side by side in the second direction (for example, the y direction or the −y direction). According to an embodiment, a virtual straight line L connecting the plurality of first connectors 27A to one another may overlap the center 10C of the display panel 10 in a plan view. A plurality of second connectors 27B may be included, and the plurality of second connectors 27B may be arranged side by side in the second direction (for example, the y direction or the −y direction). According to an embodiment, the plurality of second connectors 27B may be located adjacent to an edge of the display panel 10.

Referring to FIG. 9D, the connector 27 may further include an edge connector 27E. The edge connector 27E may be located adjacent to a corner of the display panel 10. In other words, the edge connector 27E may be located to face the corner of the display panel 10. Accordingly, when the display panel 10 is bent, a strain value may locally increase at the corner of the display panel 10, and thus damage to the display panel 10 may be effectively prevented or reduced.

Figure 9E:
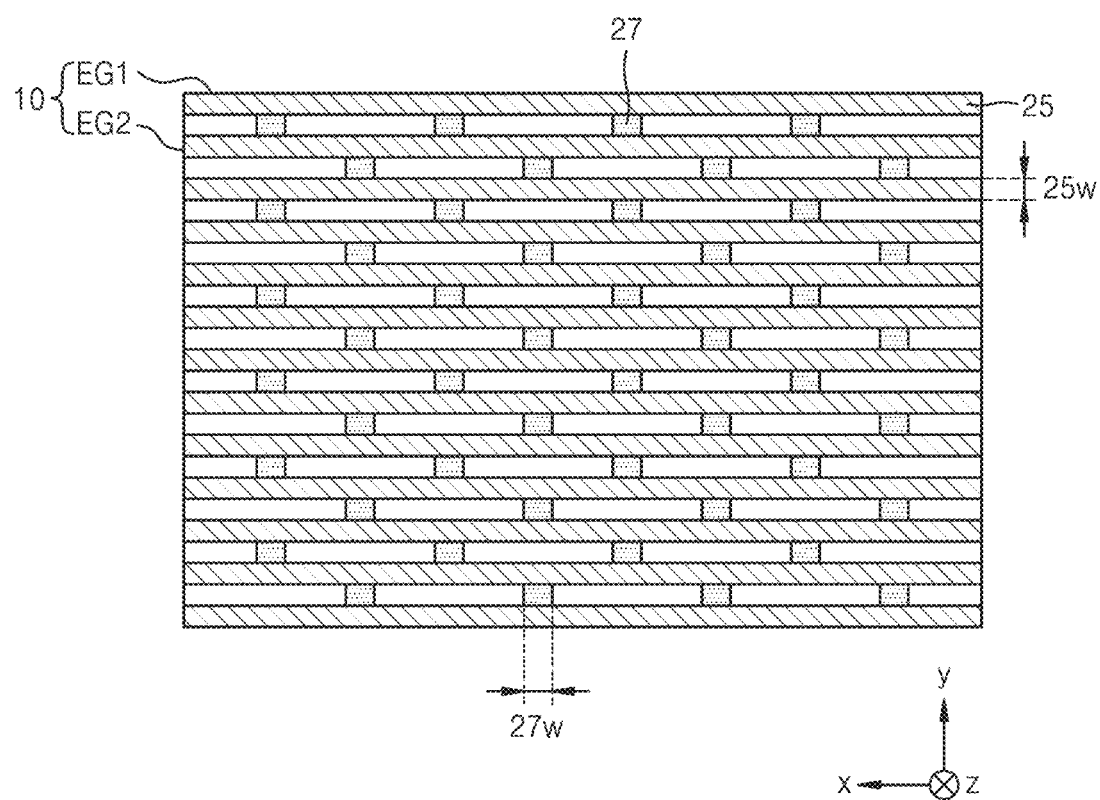

Referring to FIG. 9E, a plurality of connectors 27 may be included. According to an embodiment, the plurality of connectors 27 may be arranged in a zigzag manner.

Figure 9F:
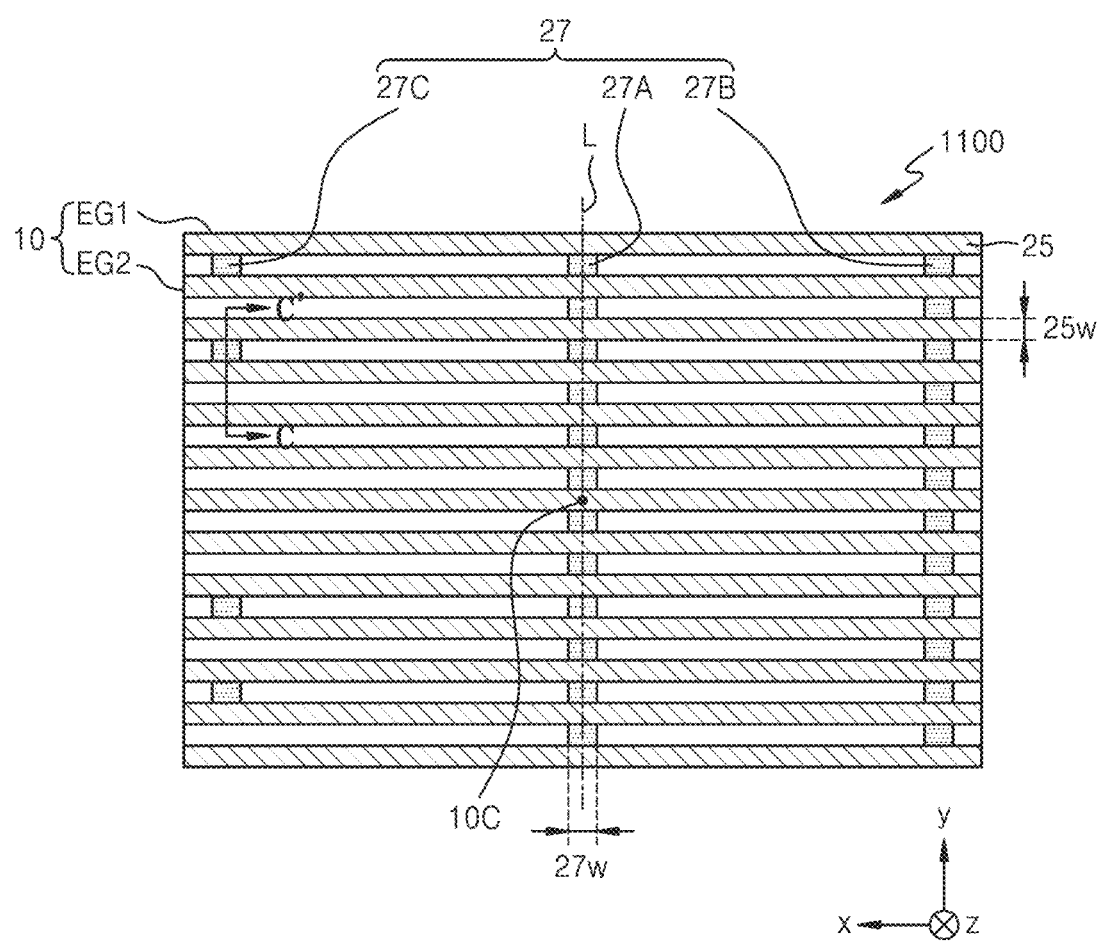

Referring to FIG. 9F, a plurality of connectors 27 may be included. The plurality of connectors 27 may include a first connector 27A, a second connector 27B, and a third connector 27C. A plurality of first connectors 27A may be included, and the plurality of first connectors 27A may be arranged side by side in the second direction (for example, the y direction or the −y direction). According to an embodiment, a virtual straight line L connecting the plurality of first connectors 27A to one another may overlap the center 10C of the display panel 10 in a plan view. A plurality of second connectors 27B may be included, and the plurality of second connectors 27B may be arranged side by side in the second direction (for example, the y direction or the −y direction). According to an embodiment, the plurality of second connectors 27B may be located adjacent to an edge of the display panel 10. A plurality of third connectors 27C may be included, and the plurality of third connectors 27C may be located between one of the plurality of supporters 25 and another one of the plurality of supporters 25. The plurality of third connectors 27C may not be located between one of the plurality of supporters 25 and another one of the plurality of supporters 25.

As such, the connector 27 may be arranged between adjacent supporters 25 in various ways, and, when the display panel 10 has been bent, a strain value may locally increase and thus damage to the display panel 10 may be effectively prevented or reduced.

Figure 10:
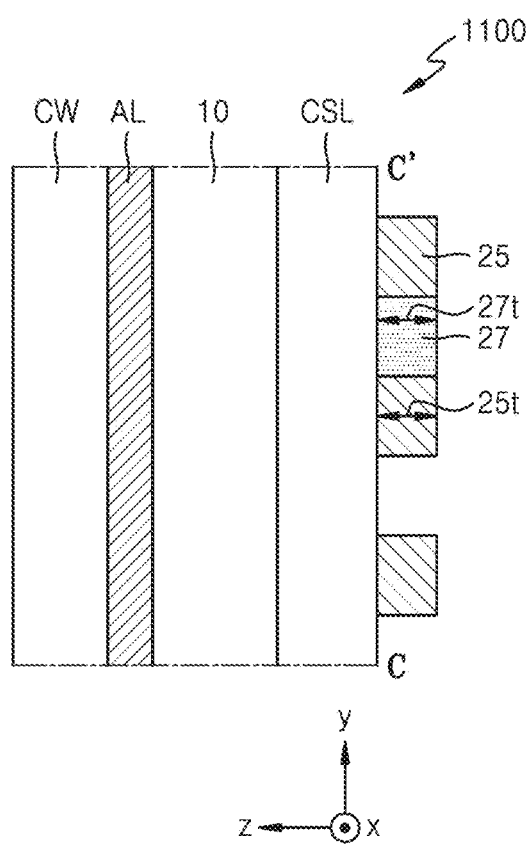
FIG. 10 is a schematic cross-sectional view of the display unit of FIG. 9F taken along line C-C' of FIG. 9F.

FIG. 10 is a schematic cross-sectional view of the display unit 1100 of FIG. 9F, taken along line C-C' of FIG. 9F. Reference numerals in FIG. 10 that are the same as the reference numerals in FIG. 5A denote the same elements, and thus repeated descriptions thereof are omitted.

Referring to FIG. 10, the display unit 1100 may include the display panel 10, the cover window CW, the adhesive layer AL, the cushion layer CSL, the plurality of supporters 25, and the connector 27.

The connector 27 may be between a plurality of supporters 25. The connector 27 may connect the plurality of supporters 25 to each other in a bridge shape. In other words, the connector 27 may contact a portion of one of the plurality of supporters 25, and the connector 27 may contact a portion of another one of the plurality of supporters 25. In this embodiment, several, short connectors 27 are used to connect two adjacent supporters 25, compared to the embodiment in FIG. 3 in which one, long connector 27 is used to connect two adjacent supporters 25.

According to an embodiment, the connector 27 may be integrally provided with the plurality of supporters 25. In other words, adjacent supporters 25 may be linked to each other. The connector 27 and the plurality of supporters 25 may include the same material. According to another embodiment, the connector 27 and the plurality of supporters 25 may include different materials. A modulus of the connector 27 and a modulus of one of the plurality of supporters 25 may be different from each other.

According to an embodiment, a thickness 27t of the connector 27 in the thickness direction (i.e., third direction) may be equal to a thickness 25t of supporter 25 in the thickness direction (i.e., third direction). According to another embodiment, the thickness 27t of the connector 27 may be different from the thickness 25t of supporter 25.

Figure 11:
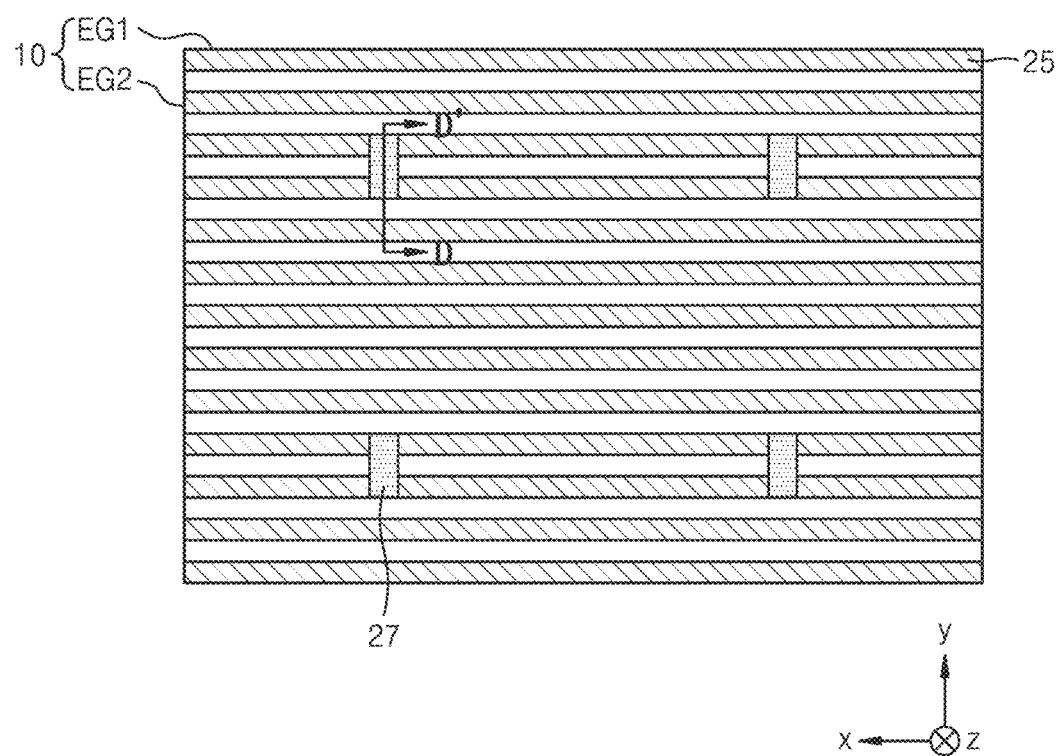
FIG. 11 is a schematic plan view of a display unit according to an embodiment.

FIG. 11 is a schematic plan view of a display unit 1100 according to an embodiment. Reference numerals in FIG. 11 that are the same as the reference numerals in FIG. 9A denote the same elements, and thus repeated descriptions thereof are omitted.

Referring to FIG. 11, the display unit 1100 may include the display panel 10, the plurality of supporters 25, and the connector 27. The display panel 10 may include the first edge EG1 extending in the first direction (for example, the x direction or the −x direction) and the second edge EG2 extending in the second direction (for example, the y direction or the −y direction).

The plurality of supporters 25 may be located behind the display panel 10. The plurality of supporters 25 may each extend in the first direction (e.g., the x direction or the −x direction). According to an embodiment, the plurality of supporters 25 may be spaced apart from one another in the second direction (e.g., the y direction or the −y direction).

The connector 27 may connect adjacent supporters 25 to each other. The connector 27 may connect the adjacent supporters 25 to each other in a bridge shape.

According to an embodiment, the connector 27 may be located on a different layer from the layer on which the plurality of supporters 25 are located. As used herein, layer is a plane defined by the first direction and the second direction. Therefore, "located on a different layer" means that two layers are located in different positions in the third direction. According to an embodiment, the connector 27 may be located behind the plurality of supporters 25. In this case, the connector 27 may be connected to the plurality of supporters 25 via an adhesive. As another example, the connector 27 may be connected to the plurality of supporters 25 by bolt coupling.

Figure 12:
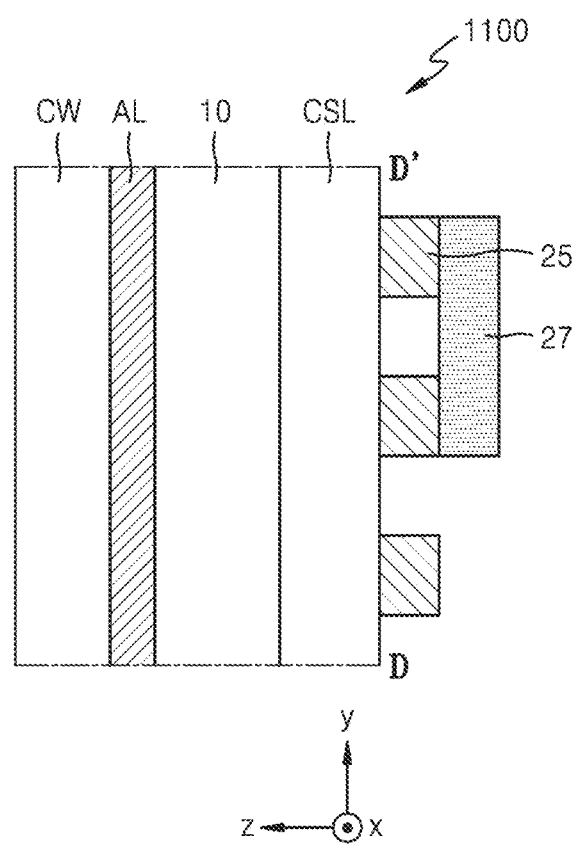
FIG. 12 is a schematic cross-sectional view of the display unit of FIG. 11 taken along line D-D' of FIG. 11.

FIG. 12 is a schematic cross-sectional view of the display unit 1100 of FIG. 11, taken along line D-D' of FIG. 11. Reference numerals in FIG. 12 that are the same as the reference numerals in FIG. 10 denote the same elements, and thus repeated descriptions thereof are omitted.

Referring to FIG. 12, the display unit 1100 may include the display panel 10, the cover window CW, the adhesive layer AL, the cushion layer CSL, the plurality of supporters 25, and the connector 27.

The connector 27 may connect adjacent supporters 25 to each other. The connector 27 may connect the adjacent supporters 25 to each other in a bridge shape.

According to an embodiment, the connector 27 may be located on a different layer from the layer on which the plurality of supporters 25 are located. According to an embodiment, the connector 27 may be located behind the plurality of supporters 25. In this case, the connector 27 may be connected to the plurality of supporters 25 via an adhesive. As another example, the connector 27 may be connected to the plurality of supporters 25 by bolt coupling.

According to an embodiment, the connector 27 may be integrally provided with the plurality of supporters 25. In other words, adjacent supporters 25 may be linked to each other. The connector 27 and the plurality of supporters 25 may include the same material. According to another embodiment, the connector 27 and the plurality of supporters 25 may include different materials. A modulus of the connector 27 and a modulus of one of the plurality of supporters 25 may be different from each other.

Figure 13:
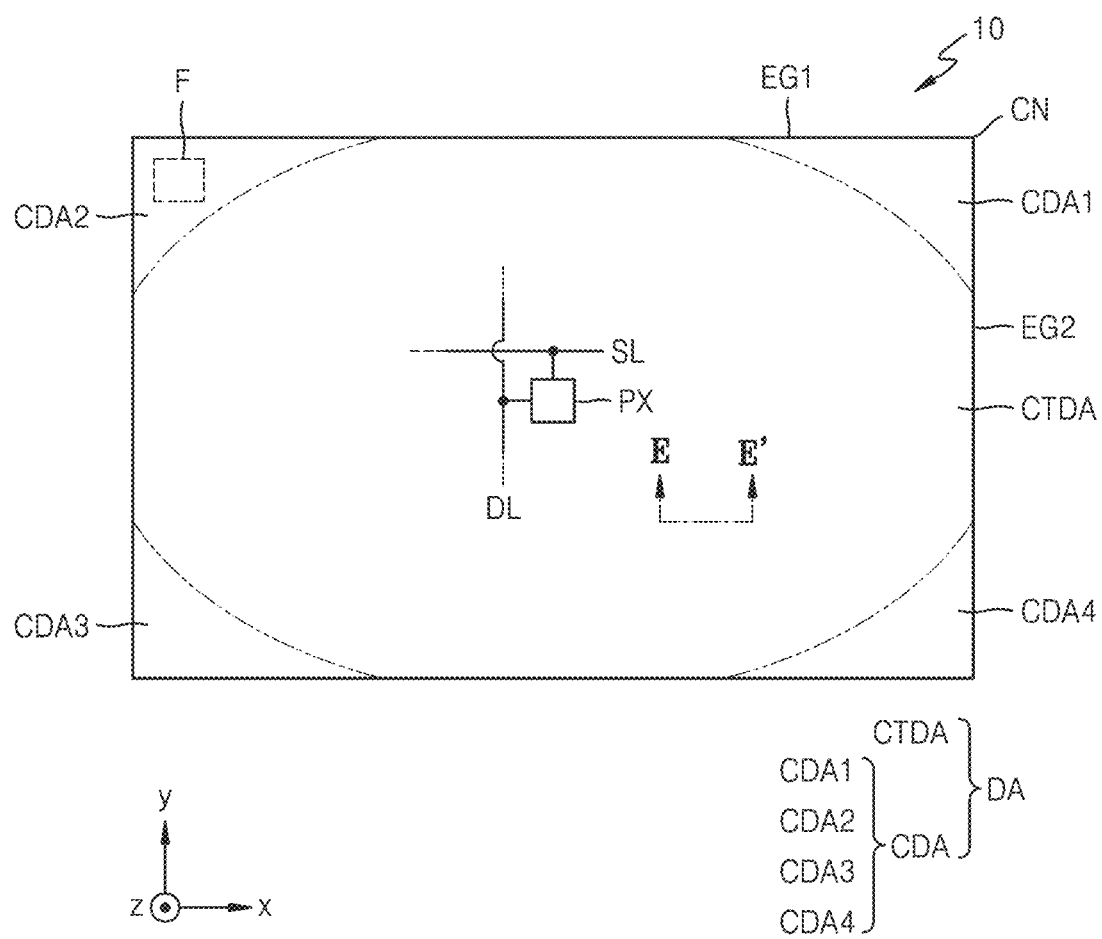
FIG. 13 is a schematic plan view of a display panel according to an embodiment.

FIG. 13 is a schematic plan view of the display panel 10 according to an embodiment. Reference numerals in FIG. 13 that are the same as the reference numerals in FIG. 2 denote the same elements, and thus repeated descriptions thereof are omitted.

Referring to FIG. 13, the display panel 10 may include edges. According to an embodiment, the display panel 10 may include the first edge EG1 extending in the first direction (for example, the x direction or the −x direction) and the second edge EG2 extending in the second direction (for example, the y direction or the −y direction). The first edge EG1 and the second edge EG2 may be ends of the display panel 10. According to an embodiment, the first edge EG1 and the second edge EG2 may meet each other.

The display panel 10 may be an organic light-emitting display panel using an organic light-emitting diode including an organic emission layer as a display element. Alternatively, the display panel 10 may be a light-emitting diode display panel using a light-emitting diode ("LED") as a display element. The size of the LED may be microscale or nanoscale. For example, the LED may be a micro-LED. As another example, the LED may be a nanorod LED. The nanorod LED may include gallium nitride (GaN). According to an embodiment, a color converting layer may be arranged on the nanorod LED. The color converting layer may include quantum dots. Alternatively, the display panel 10 may be a quantum dot light-emitting display panel using a quantum dot light-emitting diode including a quantum dot emission layer as a display element. Alternatively, the display panel 10 may be an inorganic light-emitting display panel using an inorganic light-emitting diode including an inorganic semiconductor as a display element. A case where the display panel 10 is an organic light-emitting display panel using an organic light-emitting diode as a display element will now be focused on and described in detail.

The display panel 10 may include the display area DA. The display area DA may display an image. A pixel PX may be located in the display area DA. According to an embodiment, the pixel PX may be connected to a scan line SL extending in the first direction (e.g., the x direction or the −x direction). According to an embodiment, the pixel PX may be connected to a data line DL extending in the second direction (e.g., the y direction or the −y direction).

The display panel 10 may include a plurality of pixels PX, and the display panel 10 may display an image by using the plurality of pixels PX. Each of the plurality of pixels PX may include subpixels, and each of the subpixels may emit light of a certain color by using a display element. A subpixel, as used herein, refers to a light-emission area as a minimum unit that realizes an image.

According to an embodiment, the display area DA may include a central display area CTDA and a corner display area CDA. The central display area CTDA may be located at the center of the display panel 10. The corner display area CDA may be located between the central display area CTDA and a corner CN, where edges of the display panel 10 meet each other. The corner CN may be defined as a portion where edges extending in different directions intersect each other. According to an embodiment, when the display panel 10 has a polygonal shape, the display panel 10 may include a plurality of corners CN.

According to an embodiment, the display panel 10 may include a plurality of corner display areas CDA. For example, the display panel 10 may include a first corner display area CDA1, a second corner display area CDA2, a third corner display area CDA3, and a fourth corner display area CDA4. According to an embodiment, the first corner display area CDA1 may be located between the central display area CTDA, the first edge EG1, and the second edge EG2.

The display panel 10 may include a structure and/or material that is stretchable and/or contractible. Accordingly, the display panel 10 may be bent from the first direction (e.g., the x direction or the −x direction) to the third direction (e.g., the z direction or the −z direction), and may be bent from the second direction (e.g., the y direction or the −y direction) to the third direction (e.g., the z direction or the −z direction).

According to an embodiment, in the corner display area CDA, the display panel 10 may include a structure and/or material that is stretchable and/or contractible. Accordingly, the corner display area CDA may be bent from the first direction (e.g., the x direction or the −x direction) to the third direction (e.g., the z direction or the −z direction), and may be bent from the second direction (e.g., the y direction or the −y direction) to the third direction (e.g., the z direction or the −z direction).

According to an embodiment, the corner display area CDA may be more greatly deformed than the central display area CTDA, and a magnitude of stress applied to the corner display area CDA may be greater than a magnitude of stress applied to the central display area CTDA. When the corner display area CDA includes a structure and/or material that is stretchable or contractible, a magnitude of stress applied to the corner display area CDA may be reduced, and damage to the display panel 10 in the corner display area CDA may be effectively prevented or reduced. The central display area CTDA may also include a structure and/or material that is stretchable or contractible.

Figure 14:
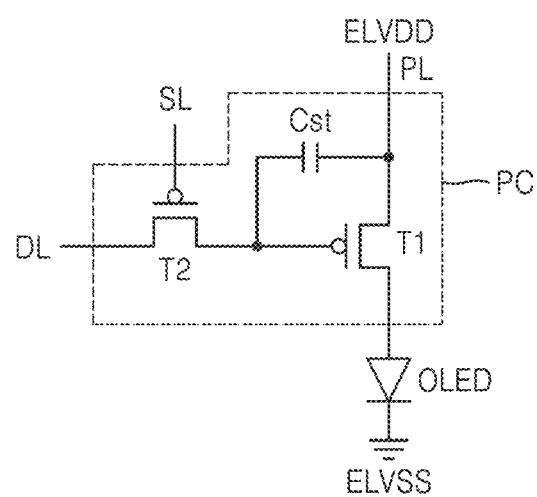
FIG. 14 is a schematic equivalent circuit diagram of a pixel circuit applicable to a display panel according to an embodiment.

FIG. 14 is a schematic equivalent circuit diagram of a pixel circuit PC applicable to a display panel according to an embodiment.

Referring to FIG. 14, the pixel circuit PC may be connected to a display element, for example, an organic light-emitting diode OLED.

The pixel circuit PC may include a driving thin-film transistor T1, a switching thin-film transistor T2, and a storage capacitor Cst. The organic light-emitting diode OLED may emit red light, green light, or blue light, or may emit red light, green light, blue light, or white light.

The switching thin-film transistor T2 may be connected to a scan line SL and a data line DL, and may transmit, to the driving thin-film transistor T1, a data signal or data voltage received via the data line DL according to a scan signal or switching voltage received via the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness according to the driving current. An opposite electrode of the organic light-emitting diode OLED may receive a second power supply voltage ELVSS.

Although the pixel circuit PC includes two thin-film transistors and one storage capacitor in FIG. 14, the pixel circuit PC may include two or more storage capacitors and/or three or more thin-film transistors.

Figure 15:
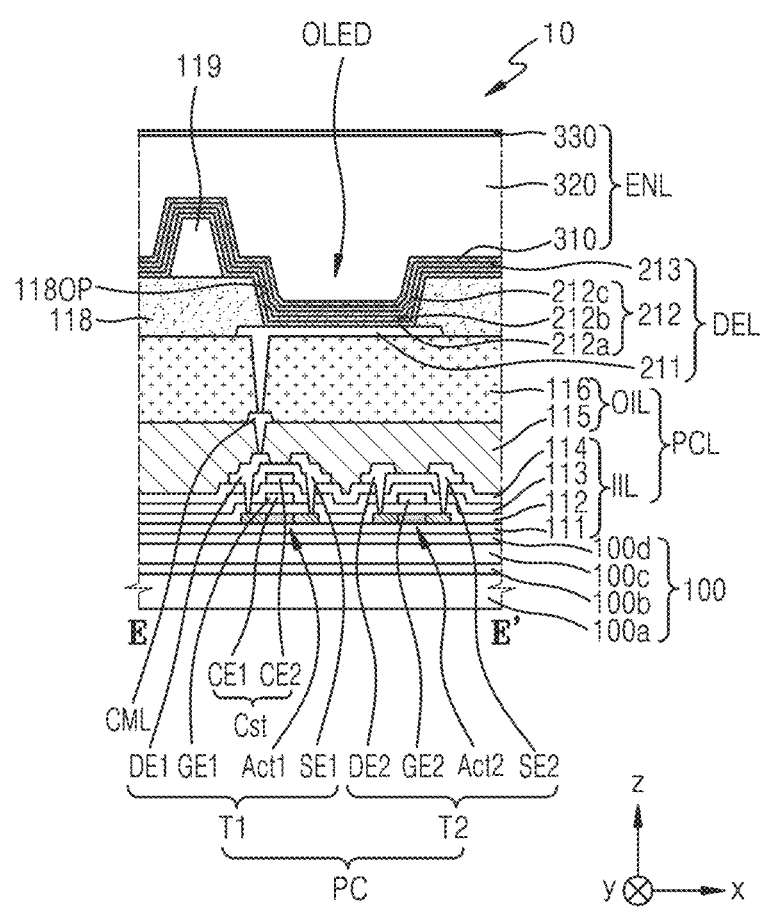
FIG. 15 is a cross-sectional view of the display panel of FIG. 13 taken along line E-E' of FIG. 13.

FIG. 15 is a cross-sectional view of the display panel 10 of FIG. 13 taken along line E-E' of FIG. 13.

Referring to FIG. 15, the display panel 10 may include a substrate 100, a pixel circuit layer PCL, a display element layer DEL, and an encapsulation layer ENL.

According to an embodiment, the substrate 100 may include a first base layer 100a, a first barrier layer 100b, a second base layer 100c, and a second barrier layer 100d. According to an embodiment, the first base layer 100a, the first barrier layer 100b, the second base layer 100c, and the second barrier layer 100d may be sequentially stacked in the substrate 100. According to another embodiment, the substrate 100 may include glass.

At least one of the first base layer 100a and the second base layer 100c may include polymer resin such as polyethersulfone, polyacrylate, polyetherimide, polyethylene naphthalate, polyethylene terephthalate, polyphenylene sulfide, polyimide, polycarbonate, cellulose triacetate, or cellulose acetate propionate.

Each of the first barrier layer 100b and the second barrier layer 100d which is a barrier layer for preventing penetration of an external foreign material may have a single or multi-layer structure including an inorganic material such as silicon nitride ($SiN_x$), silicon oxide ($SiO_2$), and/or silicon oxynitride (SiON).

The pixel circuit layer PCL may be located on the substrate 100. The pixel circuit layer PCL may include the pixel circuit PC. The pixel circuit PC may include a driving thin-film transistor T1, a switching thin-film transistor T2, and a storage capacitor Cst.

The pixel circuit layer PCL may include an inorganic insulating layer IIL and an organic insulating layer OIL located under and/or over elements of the driving thin-film transistor T1. The inorganic insulating layer IIL may include a buffer layer 111, a first gate insulating layer 112, a second gate insulating layer 113, and an interlayer insulating layer 114. The organic insulating layer OIL may include a first organic insulating layer 115 and a second organic insulating layer 116. The driving thin-film transistor T1 may include a first semiconductor layer Act1, a first gate electrode GE1, a first source electrode SE1, and a first drain electrode DE1.

The buffer layer 111 may be located on the substrate 100. The buffer layer 111 may include an inorganic insulating material, such as silicon nitride ($SiN_x$), silicon oxynitride (SiON), or silicon oxide ($SiO_2$), and may have a single-layer or multi-layer structure including the inorganic insulating material.

The first semiconductor layer Act1 may be located on the buffer layer 111. The first semiconductor layer Act1 may include polysilicon. Alternatively, the first semiconductor layer Act1 may include, for example, amorphous silicon, an oxide semiconductor, or an organic semiconductor. The first semiconductor layer Act1 may include a channel region, and a source region and a drain region arranged on opposite sides of the channel region, respectively.

The first gate electrode GE1 may overlap the channel region in a plan view. The first gate electrode GE1 may include a low-resistance metal material. The first gate electrode GE1 may include a conductive material including, for example, molybdenum (Mo), aluminum (Al), copper (Cu), and titanium (Ti), and may have a multi-layer or single-layer structure including the aforementioned materials.

The first gate insulating layer 112 between the first semiconductor layer Act1 and the first gate electrode GE1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of the storage capacitor Cst may be located on the second gate insulating layer 113. The upper electrode CE2 may overlap the first gate electrode GE1 located therebelow in a plan view. The first gate electrode GE1 of the driving thin-film transistor T1 and the upper electrode CE2, which overlap each other with the second gate insulating layer 113 therebetween, may constitute the storage capacitor Cst. In other words, the first gate electrode GE1 of the driving thin-film transistor T1 may function as a lower electrode CE1 of the storage capacitor Cst.

Thus, the storage capacitor Cst and the driving thin-film transistor T1 may overlap each other. According to some embodiments, the storage capacitor Cst and the driving thin-film transistor T1 may not overlap each other in a plan view.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multi-layer including the aforementioned materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The interlayer insulating layer 114 may be a single layer or multi-layer including the aforementioned inorganic insulating materials.

Each of the first drain electrode DE1 and the first source electrode SE1 may be located on the interlayer insulating layer 114. The first drain electrode DE1 and the first source electrode SE1 may include a highly conductive material. Each of the first drain electrode DE1 and the first source electrode SE1 may include a conductive material including Mo, Al, Cu, Ti, etc., and may have a multi-layer or single-layer structure including the aforementioned materials. According to an embodiment, the first drain electrodes DE1 and the first source electrode SE1 may have a multi-layer structure of Ti/Al/Ti.

The switching thin-film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, and thus a detailed description thereof will be omitted.

The first organic insulating layer 115 may be located to cover the first drain electrode DE1 and the first source electrode SE1. The first organic insulating layer 115 may include an organic material. For example, the first organic insulating layer 115 may include an organic insulating material, such as a commercial polymer (such as polymethyl methacrylate ("PMMA") or polystyrene ("PS")), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a blend thereof.

A connection electrode CML may be located on the first organic insulating layer 115. In this case, the connection electrode CML may be electrically connected to the first drain electrode DE1 or the first source electrode SE1 through a contact hole of the first organic insulating layer 115. The connection electrode CML may include a highly conductive material. The connection electrode CML may include a conductive material including Mo, Al, Cu, and Ti, and may have a multi-layer or single-layer structure including the aforementioned materials. According to an embodiment, the connection electrode CML may have a multi-layer structure of Ti/Al/Ti.

The second organic insulating layer 116 may cover the connection electrode CML. The second organic insulating layer 116 may include an organic material. The second organic insulating layer 116 may include an organic insulating material, such as a commercial polymer (such as PMMA or PS), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a blend thereof. According to some embodiments, the connection electrode CML and the second organic insulating layer 116 may be omitted.

The display element layer DEL may be located on the pixel circuit layer PCL. The display element layer DEL may include a display element. The organic light-emitting diode OLED that is the display element may include a pixel electrode 211, an intermediate layer 212, and an opposite electrode 213.

The pixel electrode 211 of the organic light-emitting diode OLED may be electrically connected to the connection electrode CML through a contact hole of the second organic insulating layer 116. Accordingly, the organic light-emitting diode OLED may be electrically connected to the pixel circuit PC.

The pixel electrode 211 may include conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). According to another embodiment, the pixel electrode 211 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another embodiment, the pixel electrode 211 may further include a layer formed of or include ITO, IZO, ZnO, or $In_2O_3$ over/under the aforementioned reflection layer.

A pixel-defining layer 118 defining an opening 1180P through which a center portion of the pixel electrode 211 is exposed may be located on the pixel electrode 211. The pixel-defining layer 118 may include an organic insulating material and/or an inorganic insulating material. The opening 1180P may define a light-emission area of light emitted by the organic light-emitting diode OLED. For example, a width of the opening 1180P may correspond to a width of the light-emission area in a plan view.

A spacer 119 may be located on the pixel-defining layer 118. A mask sheet may be used in a method of manufacturing the display panel 10. In this case, the mask sheet may enter the opening 1180P of the pixel-defining layer 118 or may adhere to the pixel-defining layer 118. The spacer 119 may prevent a defect such as damage to or destruction of the substrate 100 and a multi-layered film on the substrate 100 due to the mask sheet when a deposition material is deposited on the substrate 100.

The spacer 119 may include an organic material such as polyimide. Alternatively, the spacer 119 may include an inorganic insulating material such as silicon nitride (SiNx) or silicon oxide ($SiO_2$), or may include an inorganic insulating material and an organic insulating material.

According to an embodiment, the spacer 119 may include a material different from that included in the pixel-defining layer 118. According to another embodiment, the spacer 119 may include the same material as that included in the pixel-defining layer 118. In this case, the pixel-defining layer 118 and the spacer 119 may be formed together in a mask process using a halftone mask or the like.

The intermediate layer 212 may be located on the pixel-defining layer 118 and the pixel electrode 211. The intermediate layer 212 may include an emission layer 212b located in the opening 1180P of the pixel-defining layer 118. The emission layer 212b may include a low molecular weight or high molecular weight organic material that emits light of a certain color.

A first functional layer 212a and a second functional layer 212c may be located under and over the emission layer 212b, respectively. The first functional layer 212a may include a hole transport layer ("HTL"), or may include an HTL and a hole injection layer ("HIL"). The second functional layer 212c is a component located over the emission layer 212b, and is optional. The second functional layer 212c may include an electron transport layer ("ETL") and/or an electron injection layer ("EIL"). The first functional layer 212a and/or the second functional layer 212c may be a common layer that entirely covers the substrate 100, similar to an opposite electrode 213 to be described later.

The opposite electrode 213 may include a conductive material having a low work function. For example, the opposite electrode 213 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 213 may further include a layer, such as ITO, IZO, ZnO, or $In_2O_3$, on the (semi)transparent layer including any of the above-described materials.

According to some embodiments, a capping layer (not shown) may be further located on the opposite electrode 213. The capping layer may include lithium fluoride (LiF), an inorganic material, or/and an organic material.

The encapsulation layer ENL may be located on the opposite electrode 213. According to an embodiment, the encapsulation layer ENL may include at least one inorganic encapsulation layer and at least one organic encapsulation layer. According to an embodiment, FIG. 15 illustrates the encapsulation layer ENL including a first inorganic encapsulation layer 310, an organic encapsulation layer 320, and a second inorganic encapsulation layer 330 sequentially stacked on each other.

Each of the first inorganic encapsulation layer 310 and the second inorganic encapsulation layer 330 may include at least one inorganic material from among aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride (SiNx), and silicon oxynitride (SiON). The organic encapsulation layer 320 may include a polymer-based material. Examples of the polymer-based material may include an acrylic resin, an epoxy-based resin, polyimide, and polyethylene. According to an embodiment, the organic encapsulation layer 320 may include acrylate.

Although not shown in FIG. 15, a touch electrode layer may be located on the encapsulation layer ENL, and an optical functional layer may be located on the touch electrode layer. The touch electrode layer may obtain coordinate information based on an external input, for example, a touch event. The optical functional layer may reduce reflectance of light (external light) externally incident on the display apparatus, and/or may improve color purity of light emitted by the display apparatus. According to an embodiment, the optical functional layer may include a phase retarder and/or a polarizer. The phase retarder may be of a film type or liquid coating type, and may include a λ/2 phase retarder and/or a λ/4 phase retarder. The polarizer may also be of a film type or liquid coating type. The film type polarizer may include a stretchable synthetic resin film, and the liquid coating type polarizer may include liquid crystals arranged in a certain arrangement. The phase retarder and the polarizer may further include protective films, respectively.

According to another embodiment, the optical functional layer may include a black matrix and color filters. The color filters may be arranged by taking into account the colors of light beams emitted by the pixels of the display panel, respectively. Each of the color filters may include a pigment or dye of a red, green, or blue color. Alternatively, each of the color filters may further include quantum dots in addition to the above-described pigment or dye. Alternatively, some of the color filters may not include the above-described pigment or dye, and may include scattered particles such as titanium oxide.

According to another embodiment, the optical functional layer may include a destructive interference structure. The destructive interference structure may include a first reflection layer and a second reflection layer located on different layers. First reflected light and second reflected light reflected by the first reflection layer and the second reflection layer, respectively, may destructively interfere with each other, and thus the reflectance of external light may be reduced.

An adhesive member may be between the touch electrode layer and the optical functional layer. The adhesive member may employ a general one known to the art without limitation. The adhesive member may be a PSA.

Figure 16:
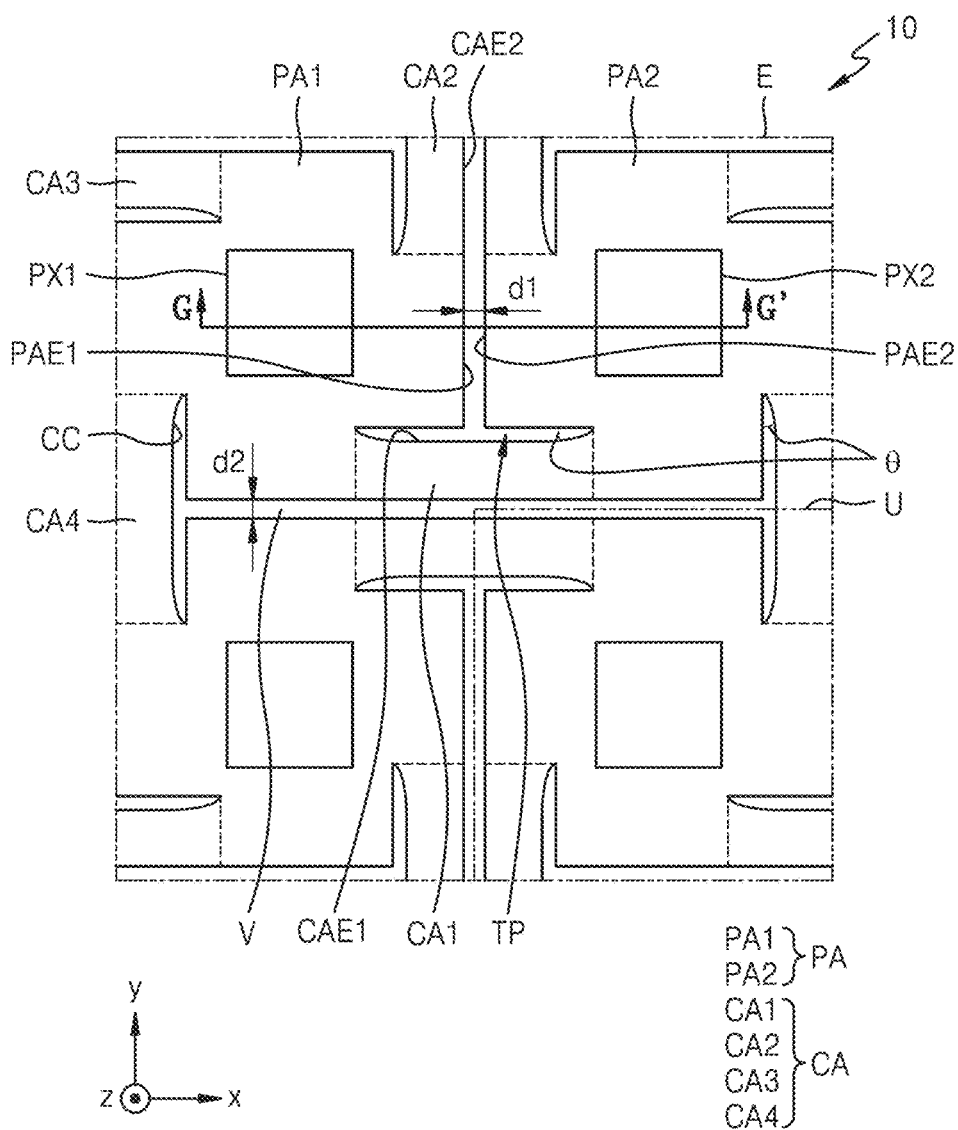
FIG. 16 is an enlarged view of a portion F of the display panel of FIG. 13, according to an embodiment.

FIG. 16 is an enlarged view of a portion F of the display panel 10 of FIG. 13, according to an embodiment.

Referring to FIG. 16, the display panel 10 may define a through-portion TP penetrating the display panel 10. A component of the display panel 10 may not be located in the through-portion TP. Accordingly, the display panel 10 may be stretched and/or contracted without damage. According to another embodiment, the display panel 10 may not include the through-portion TP. In this case, the display panel 10 may include a material that is stretchable and/or contractible. A case where the display panel 10 defines the through-portion TP will now be focused on and described in detail.

The display panel 10 may include a pixel area PA and a connection area CA. The pixel area PA may be an area where a pixel is located. The pixel area PA may include a first pixel area PA1 and a second pixel area PA2. A first pixel PX1 may be located in the first pixel area PA1. A second pixel PX2 may be located in the second pixel area PA2. The connection area CA may include a first connection area CA1, a second connection area CA2, a third connection area CA3, and a fourth connection area CA4.

A plurality of pixel areas PA may be spaced apart from one another in the first direction (e.g., the x direction or the −x direction) and/or the second direction (e.g., the y direction or the −y direction). According to an embodiment, the plurality of pixel areas PA may be spaced apart from one another by a first interval d1 and a second interval d2. For example, the first pixel area PA1 and the second pixel area PA2 may be spaced apart from each other in the first direction (e.g., the x direction or the −x direction) and/or the second direction (e.g., the y direction or the −y direction).

The connection area CA may extend between adjacent pixel areas PA. According to an embodiment, each pixel area PA may be connected to four connection areas CA. Four connection areas CA connected to one pixel area PA may extend in different directions, and each connection area CA may be connected to another pixel area PA adjacent to the one pixel area PA.

According to an embodiment, the first connection area CA1 may extend from the first pixel area PA1 to the second pixel area PA2. Accordingly, the first pixel area PA1 and the second pixel area PA2 may be connected by the first connection area CA1, and the first pixel area PA1, the second pixel area PA2, and the first connection area CA1 may be integrally provided with one another.

According to an embodiment, at least a portion of the through-portion TP may be defined by an edge PAE1 of the first pixel area PA1, an edge PAE2 of the second pixel area PA2, and an edge CAE1 of the first connection area CA1. According to an embodiment, at least a portion of the through-portion TP may be defined by the edge PAE1 of the first pixel area PA1, the edge PAE2 of the second pixel area PA2, the edge CAE1 of the first connection area CA1, and an edge CAE2 of the second connection area CA2.

One pixel area PA and portions of the connection areas CA extending from the pixel area PA may be defined as one basic unit U. The basic unit U may be repeatedly located in the first direction (e.g., the x direction or the −x direction) and the second direction (e.g., the y direction or the −y direction), and the display panel 10 may be provided by connecting the basic units U that are repeatedly located. Two adjacent basic units U may be symmetric to each other. For example, in FIG. 16, two basic units U that are laterally adjacent to each other may be symmetric to each other about an axis of symmetry that is located between the two basic units U and is parallel to the second direction (e.g., the y direction or the −y direction). Likewise, in FIG. 16, two basic units U that are vertically adjacent to each other may be symmetric to each other about an axis of symmetry that is located between the two basic units U and is parallel to the first direction (e.g., the x direction or the −x direction).

Adjacent basic units U from among the plurality of basic units U, for example, four basic units U illustrated in FIG. 16, may provide a closed curve CL therebetween, and the closed curve CL may define a separation area V that is an empty space. The separation area V may be defined by the closed curve CL including edges of a plurality of pixel areas PA and edges of a plurality of connection areas CA. Each separation area V may penetrate a top surface and a bottom surface of the display panel 10. The separation area V may overlap the through-portion TP of the display panel 10 in a plan view.

According to an embodiment, an angle θ between the edge CAE1 of the first connection area CA1 and the edge PAE2 of the second pixel area PA2 may be an acute angle. When a tensile force and/or a compressive force is applied to the display panel 10, the angle θ between the edge CAE1 of the first connection area CA1 and the edge PAE2 of the second pixel area PA2 may be changed.

The first pixel PX1 and the second pixel PX2 may overlap the first pixel area PA1 and the second pixel area PA2 in a plan view, respectively. According to an embodiment, each of the first pixel PX1 and the second pixel PX2 may include a red sub-pixel, a green sub-pixel, and a blue sub-pixel. According to another embodiment, each of the first pixel PX1 and the second pixel PX2 may include a red sub-pixel, a green sub-pixel, a blue sub-pixel, and a white sub-pixel.

A structure of the display panel 10 of the corner display area CDA is described as a structure of the display panel 10 of FIG. 16. However, according to another embodiment, a structure of the display panel 10 of the central display area CTDA of FIG. 13 may also be the same as or similar to the structure of the display panel 10 of FIG. 16.

Figure 17:
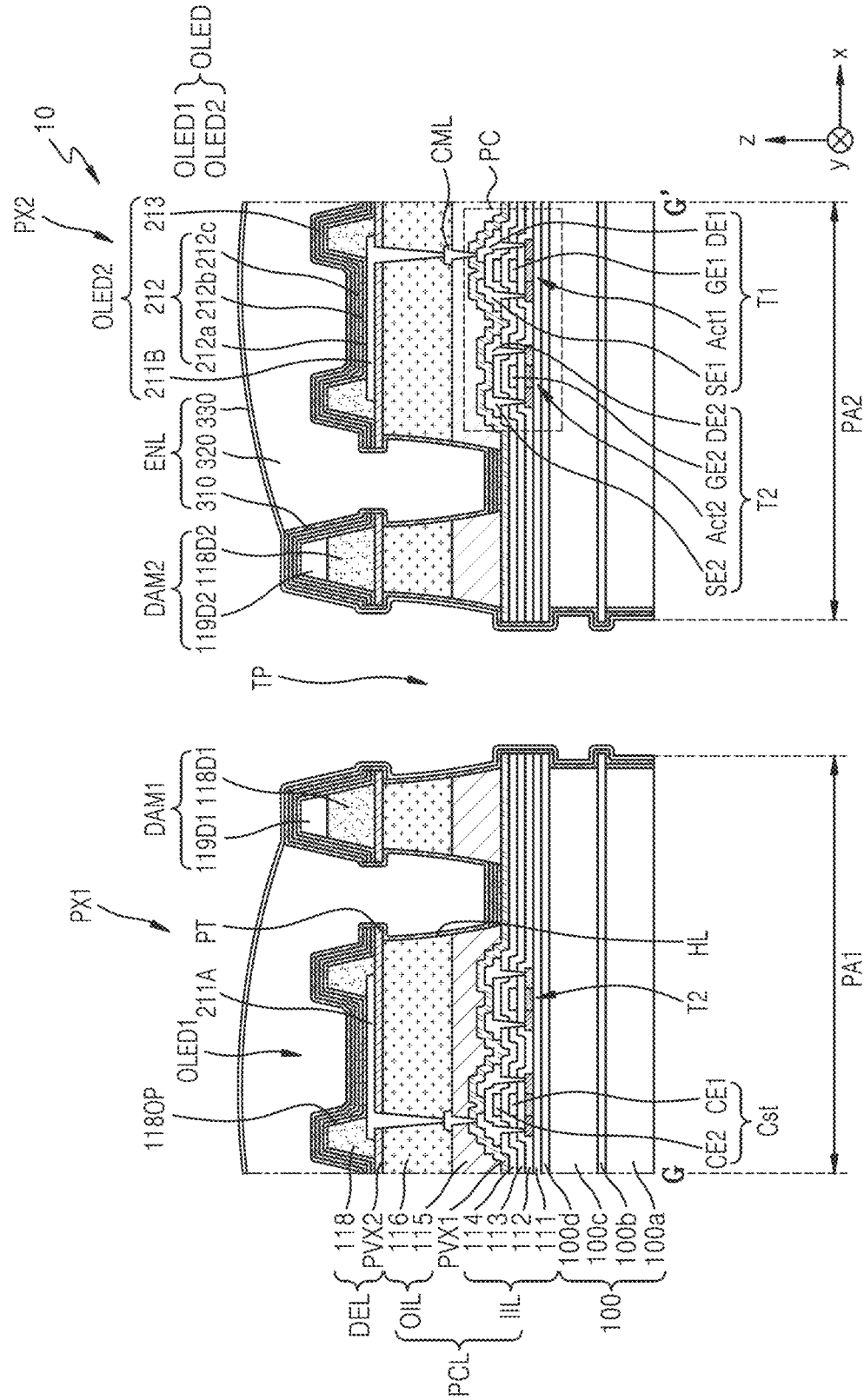
FIG. 17 is a schematic cross-sectional view of the display panel of FIG. 16 taken along line G-G' of FIG. 16.

FIG. 17 is a schematic cross-sectional view of the display panel 10 of FIG. 16 taken along line G-G' of FIG. 16. Reference numerals in FIG. 17 that are the same as the reference numerals in FIG. 15 denote the same elements, and thus repeated descriptions thereof are omitted.

Referring to FIG. 17, the display panel 10 defines the through-portion TP. The first pixel area PA1 and the second pixel area PA2 may be separated from each other with the through-portion TP therebetween. An edge of the first pixel area PA1 and an edge of the second pixel area PA2 may define at least a portion of the through-portion TP.

The display panel 10 may include the substrate 100, the pixel circuit layer PCL, the display element layer DEL, and the encapsulation layer ENL. According to an embodiment, the substrate 100, the pixel circuit layer PCL, the display element layer DEL, and the encapsulation layer ENL may be separated with the through-portion TP therebetween. According to an embodiment, the pixel circuit layer PCL may further include a first inorganic layer PVX1. According to an embodiment, the display element layer DEL may further include a second inorganic layer PVX2.

A stack structure of the display panel 10 providing the through-portion TP will now be described in detail. However, a stack structure of the display panel 10 providing the through-portion TP is not limited thereto, and various embodiments may be made.

The organic insulating layer OIL may define a hole HL. According to an embodiment, the hole HL may be provided by overlapping a hole of the first organic insulating layer 115 and a hole of the second organic insulating layer 116 in a plan view. According to another embodiment, the hole HL may be provided in the second organic insulating layer 116. In this case, a top surface of the first organic insulating layer 115 may be exposed through the hole of the second organic insulating layer 116. A case where the hole HL is provided in the first organic insulating layer 115 and the second organic insulating layer 116 will now be focused on and described in detail.

According to some embodiments, the organic insulating layer OIL may include a groove provided in a thickness direction of the organic insulating layer OIL, instead of the hole HL. According to some embodiments, the organic insulating layer OIL may not provide the hole HL or the groove.

According to an embodiment, the first inorganic layer PVX1 may be located between the interlayer insulating layer 114 and the first organic insulating layer 115. The first inorganic layer PVX1 may cover the first source electrode SE1, the first drain electrode DE1, the second source electrode SE2, and the second drain electrode DE2. According to an embodiment, the first inorganic layer PVX1 may have a contact hole through which the first source electrode SE1 or the first drain electrode DE1 is electrically connected to the connection electrode CML.

According to another embodiment, the first inorganic layer PVX1 may be located between the first organic insulating layer 115 and the second organic insulating layer 116. In this case, the first inorganic layer PVX1 may cover the connection electrode CML. At least a portion of the first inorganic layer PVX1 may be exposed through the hole HL. The first inorganic layer PVX1 may be a single layer or multi-layer including inorganic materials such as $SiN_x$ and/or $SiO_2$. According to some embodiments, the first inorganic layer PVX1 may be omitted.

The organic light-emitting diode OLED may be located on the second organic insulating layer 116. The organic light-emitting diode OLED may include a first organic light-emitting diode OLED1 and a second organic light-emitting diode OLED2. The first organic light-emitting diode OLED1 that is a first display element may be located on the substrate 100 to overlap the first pixel area PA1 in a plan view. The first organic light-emitting diode OLED1 may implement the first pixel PX1. The second organic light-emitting diode OLED2 that is a second display element may be located on the substrate 100 to overlap the second pixel area PA2 in a plan view. The second organic light-emitting diode OLED2 may implement the second pixel PX2.

The first organic light-emitting diode OLED1 may include a first pixel electrode 211A, the intermediate layer 212, and the opposite electrode 213. The second organic light-emitting diode OLED2 may include a second pixel electrode 211B, the intermediate layer 212, and the opposite electrode 213. Each of the first pixel electrode 211A and the second pixel electrode 211B may be connected to the connection electrode CML through a contact hole of the second organic insulating layer 116.

The second inorganic layer PVX2 may be located between the organic light-emitting diode OLED and the second organic insulating layer 116. The second inorganic layer PVX2 may include a plurality of inorganic patterns spaced apart from one another on the second organic insulating layer 116. The second inorganic layer PVX2 may include a protruding tip PT that protrudes toward the center of the hole HL. Accordingly, a bottom surface of the protruding tip PT may be exposed through the hole HL. In other words, the hole HL may have an undercut structure. The second inorganic layer PVX2 may be a single layer or multi-layer including inorganic materials such as $SiN_x$ and/or $SiO_2$.

The hole HL and the protruding tip PT of the second inorganic layer PVX2 may be a structure for disconnecting the first functional layer 212a and the second functional layer 212c. According to an embodiment, the first functional layer 212a, the second functional layer 212c, and the opposite electrode 213 may be formed on the entire surface of the substrate 100. In this case, each of the first functional layer 212a and the second functional layer 212c may include an organic material, and external oxygen or moisture may be introduced from the through-portion TP into the organic light-emitting diode OLED through at least one of the first functional layer 212a and the second functional layer 212c. The oxygen or moisture may damage the organic light-emitting diode OLED. The hole HL and the protruding tip PT of the second inorganic layer PVX2 may disconnect the first functional layer 212a and the second functional layer 212c, and separated first functional layer pattern and second functional layer pattern may be located in the hole HL. Accordingly, introduction of moisture or oxygen from the through-portion TP into the organic light-emitting diode OLED may be prevented, and damage to the organic light-emitting diode OLED may be effectively prevented. However, a structure for disconnecting the first functional layer 212a and the second functional layer 212c is not limited thereto, and any of various structures for disconnecting the first functional layer 212a and the second functional layer 212c may be applied to the display panel 10.

A first dam portion DAM1 and a second dam portion DAM2 may be located on the second inorganic layer PVX2. Each of the first dam portion DAM1 and the second dam portion DAM2 may protrude in a thickness direction of the substrate 100 from the second inorganic layer PVX2. The first dam portion DAM1 and the second dam portion DAM2 may be located adjacent to the through-portion TP.

The first dam portion DAM1 may be located in the first pixel area PA1. According to an embodiment, the first dam portion DAM1 may surround the first organic light-emitting diode OLED1. The first dam portion DAM1 may be located closer to the through-portion TP than the hole HL. The first dam portion DAM1 may include a first pattern layer 118D1 and a second upper pattern layer 119D2. According to an embodiment, the first pattern layer 118D1 may include the same material as a material of the pixel-defining layer 118. The first upper pattern layer 119D1 may include an organic insulating material and/or an inorganic insulating material.

The second dam portion DAM2 may be located in the second pixel area PA2. According to an embodiment, the second dam portion DAM2 may surround the second organic light-emitting diode OLED2. The second dam portion DAM2 may be located closer to the through-portion TP than the hole HL. The second dam portion DAM2 may include a second pattern layer 118D2 and a second upper pattern layer 119D2. According to an embodiment, the second pattern layer 118D2 may include the same material as a material of the pixel-defining layer 118 and the first pattern layer 118D1. The pixel-defining layer 118, the first pattern layer 118D1, and the second pattern layer 118D2 may be simultaneously formed. The second upper pattern layer 119D2 may include an organic insulating material and/or an inorganic insulating material. The second upper pattern layer 119D2 may include the same material as a material of the first upper pattern layer 119D1. The first upper pattern layer 119D1 and the second upper pattern layer 119D2 may be simultaneously formed. According to some embodiments, at least one of the first dam portion DAM1 and the second dam portion DAM2 may be omitted.

The encapsulation layer ENL may cover the first organic light-emitting diode OLED1 and the second organic light-emitting diode OLED2. The encapsulation layer ENL may be located on the opposite electrode 213. The encapsulation layer ENL may be separated with the through-portion TP therebetween. According to an embodiment, the encapsulation layer ENL may include at least one inorganic encapsulation layer and at least one organic encapsulation layer. According to an embodiment, FIG. 17 illustrates the encapsulation layer ENL including the first inorganic encapsulation layer 310, the organic encapsulation layer 320, and the second inorganic encapsulation layer 330 sequentially stacked on each other.

The first inorganic encapsulation layer 310 may cover the organic light-emitting diode OLED. The first inorganic encapsulation layer 310 may entirely and continuously cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact the protruding tip PT of the second inorganic layer PVX2. The first inorganic encapsulation layer 310 may contact the first inorganic layer PVX1. Accordingly, moisture or oxygen may be prevented from being introduced from the through-portion TP into the organic light-emitting diode OLED through a layer including an organic material. The first inorganic encapsulation layer 310 may be separated by the through-portion TP.

The organic encapsulation layer 320 may be located on the first inorganic encapsulation layer 310. The organic encapsulation layer 320 may overlap the first organic light-emitting diode OLED1 and the second organic light-emitting diode OLED2 in a plan view, and the organic encapsulation layer 320 may fill the hole HL. According to an embodiment, the organic encapsulation layer 320 may be separated by the through-portion TP. For example, the organic encapsulation layer 320 overlapping the first organic light-emitting diode OLED1 in a plan view may extend to the first dam portion DAM1. The organic encapsulation layer 320 overlapping the second organic light-emitting diode OLED2 may extend to the second dam portion DAM2. Because the first dam portion DAM1 and the second dam portion DAM2 protrude in the thickness direction of the substrate 100 from a top surface of the second inorganic layer PVX2, the flow of the organic encapsulation layer 320 may be controlled.

The second inorganic encapsulation layer 330 may cover the organic encapsulation layer 320. The second inorganic encapsulation layer 330 may entirely and continuously cover the substrate 100. The second inorganic encapsulation layer 330 may contact the first inorganic encapsulation layer 310 on the first dam portion DAM1 and the second dam portion DAM2. Accordingly, the organic encapsulation layer 320 may be separated by the first dam portion DAM1 and the second dam portion DAM2. The second inorganic encapsulation layer 330 may be separated by the through-portion TP.

An embodiment of a method of controlling a display apparatus for bending the display panel 10 by controlling the display apparatus 1 and/or an embodiment of the display apparatus 1 including the bent display panel 10 will now be described.

Figure 18:
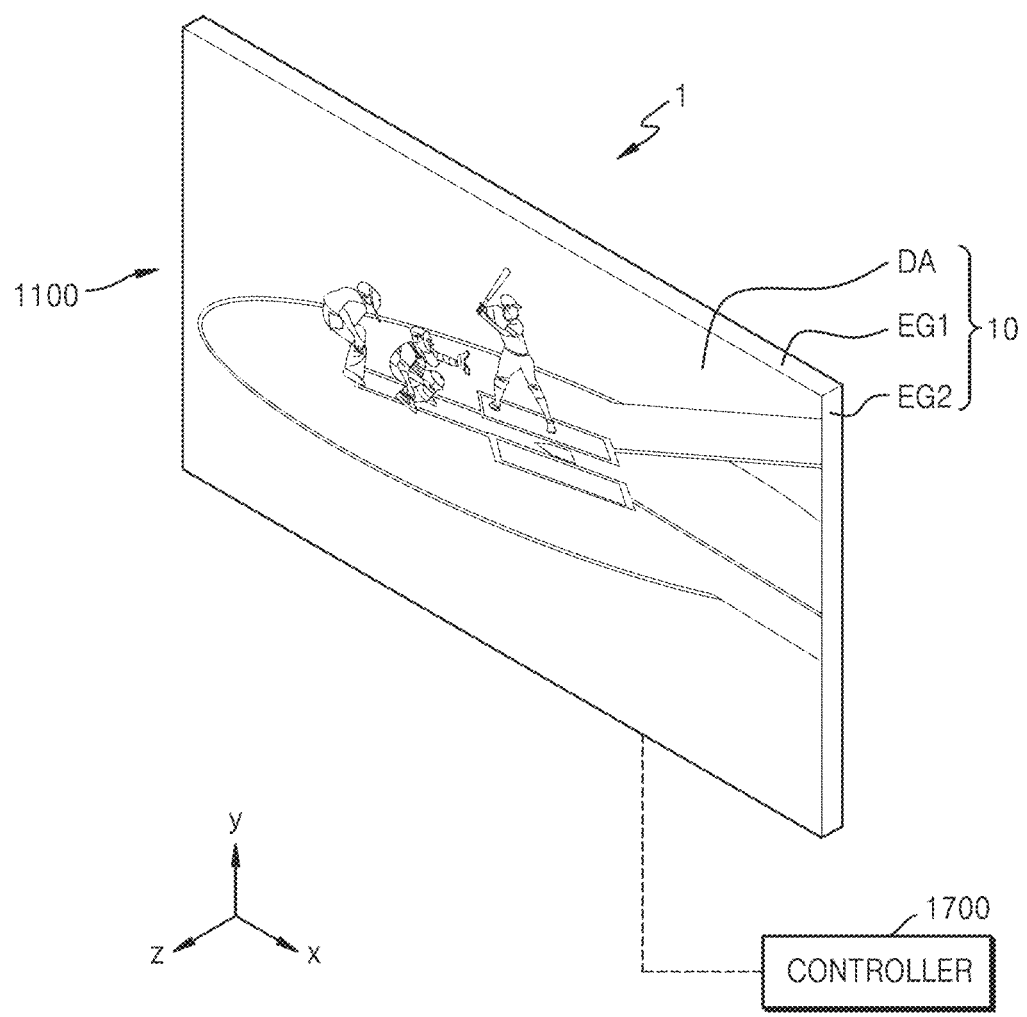
FIG. 18 is a schematic perspective view of a shape before a display apparatus for displaying an image is bent.
Figure 19:
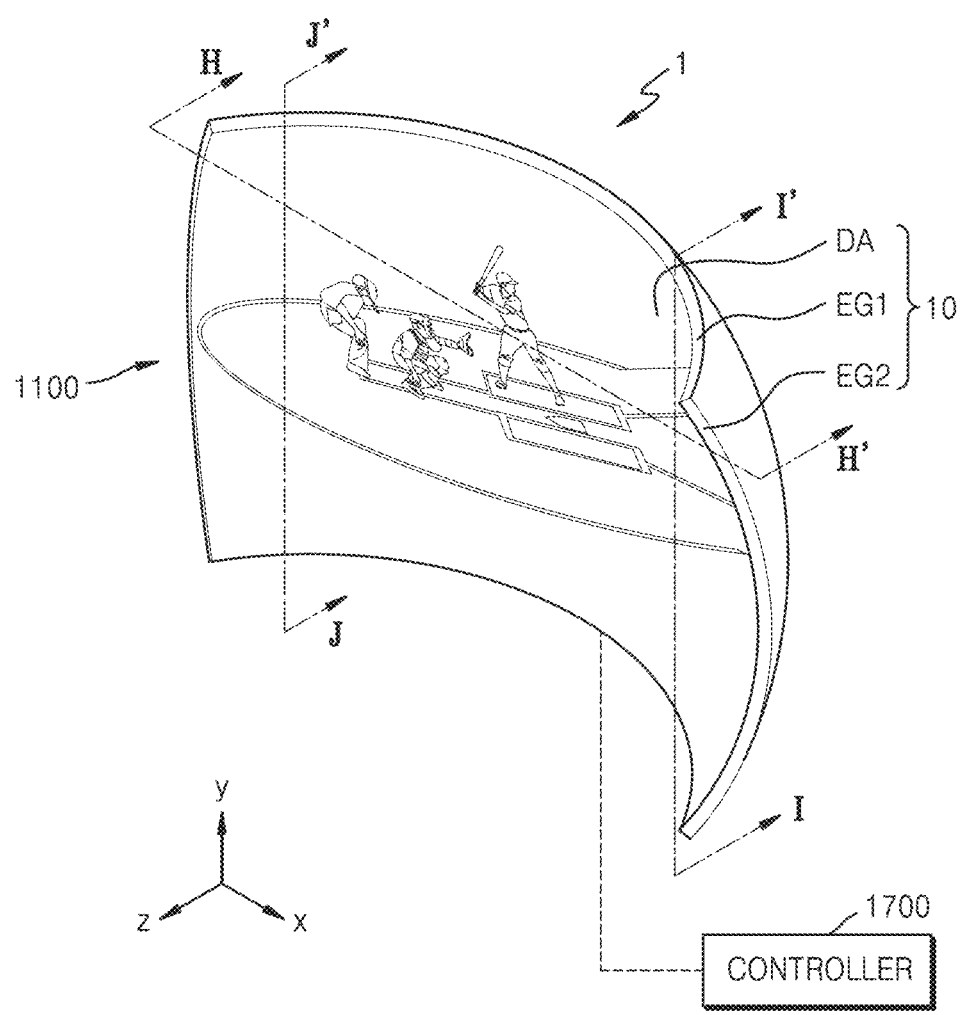
FIGS. 19 and 20 are schematic perspective views of a shape after a display apparatus for displaying an image is bent.
Figure 20:
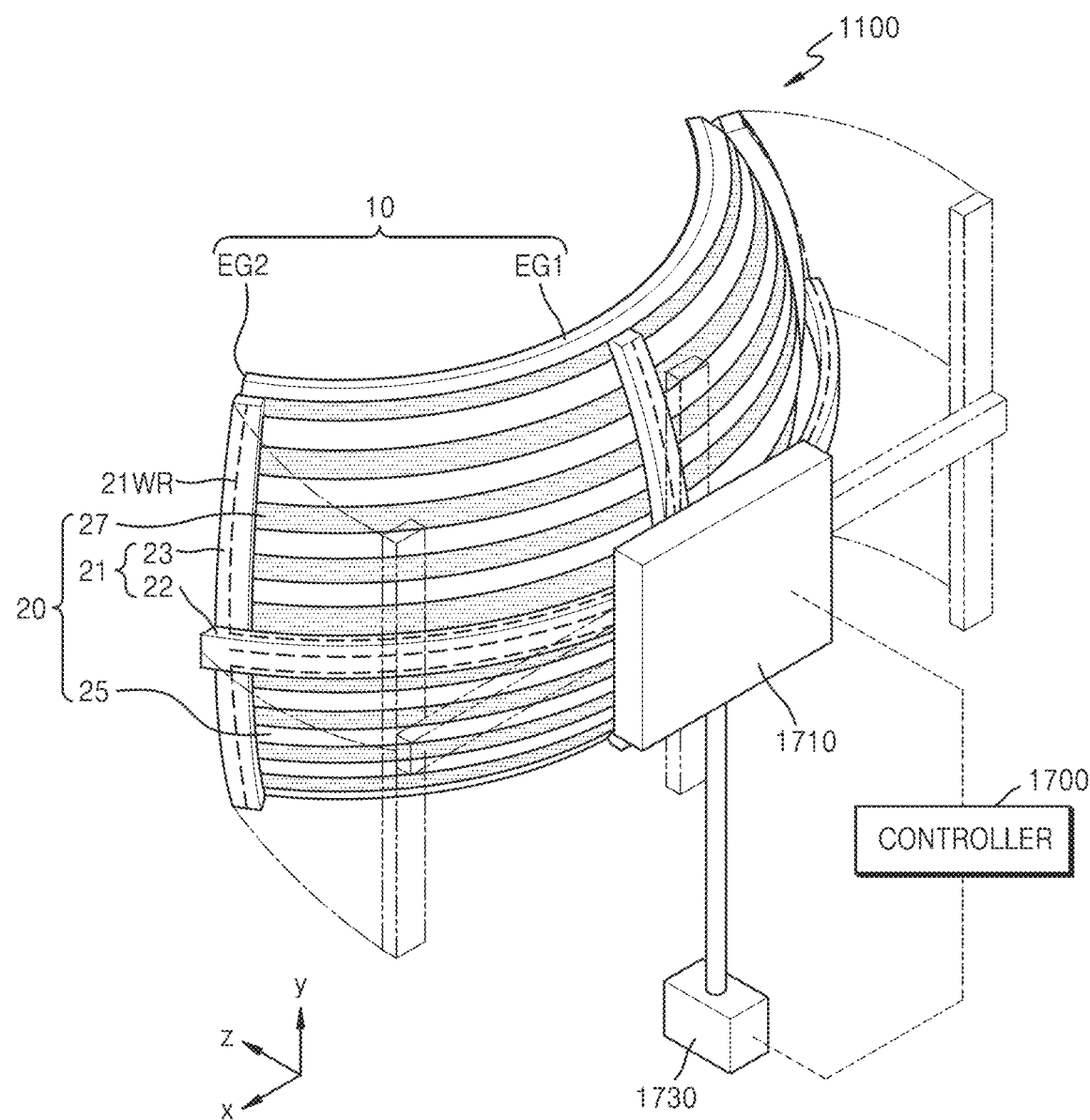

FIG. 18 is a schematic perspective view of a shape before the display apparatus 1 for displaying an image is bent. FIGS. 19 and 20 are schematic perspective views of a shape after the display apparatus 1 for displaying an image is bent. FIG. 19 is a perspective view of a front side of the display unit 1100, and FIG. 20 is a perspective view of a rear side of the display unit 1100.

Referring to FIG. 18, an image may be displayed in the display area DA of the display panel 10. The display panel 10 may include edges. According to an embodiment, the display panel 10 may include the first edge EG1 extending in the first direction (for example, the x direction or the −x direction) and the second edge EG2 extending in the second direction (for example, the y direction or the −y direction).

When the first edge EG1 extends in the first direction (e.g., the x direction or the −x direction) and the second edge EG2 extends in the second direction (e.g., the y direction or the −y direction), the display area DA of the display panel 10 may be a flat plane. When the display area DA is a flat plane, a distortion felt by a plurality of users who watch an image displayed in the display area DA may be prevented or reduced. Also, even when an image of the display apparatus 1 is watched from various angles, a distortion felt by a user may be effectively prevented or reduced.

The controller 1700 may obtain information to bend the display panel 10. According to an embodiment, the information obtained to bend the display panel 10 may be information corresponding to a manipulation of a remote controller connected to the display apparatus 1. According to another embodiment, the information obtained to bend the display panel 10 may be information corresponding to a voice signal of the user who watches the image. According to another embodiment, the information obtained to bend the display panel 10 may be information on a type of content included in the image. According to another embodiment, the information obtained to bend the display panel 10 may be location information of at least one user who watches the image. For example, the location information of the at least one user may be location information of one user. As another example, the location information of the at least one user may be location information of a plurality of users.

Referring to FIG. 19, the display panel 10 may be bent. According to an embodiment, in a state where the display panel 10 is bent, the first edge EG1 may have a curvature. In this case, a location of a point of the second edge EG2 may be changed in the first direction (e.g., the x direction or the −x direction). The location of the point of the second edge EG2 may be changed to be closer to the center of the display panel 10 in the first direction. Also, the location of the point of the second edge EG2 may be changed in the third direction (e.g., the z direction or the −z direction). In particular, the location of the point of the second edge EG2 may be changed to the z direction of FIG. 19.

According to an embodiment, in a state where the display panel 10 is bent, the second edge EG2 may have a curvature. In this case, a location of a point of the first edge EG1 may be changed in the second direction (e.g., they direction or the −y direction). The location of the point of the first edge EG1 may be changed to be closer to the center of the display panel 10 in the second direction. Also, the location of the point of the first edge EG1 may be changed in the third direction (e.g., the z direction or the −z direction). In particular, the location of the point of the first edge EG1 may be changed to the z direction of FIG. 19. Accordingly, the display panel 10 may be changed into a concave shape. In this case, the presence and/or immersion of a user who watches an image displayed in the display area DA may increase.

An embodiment may include a state where the display panel 10 is flat and a state where the display panel 10 is bent and concave. Accordingly, a size of a space occupied by the display apparatus 1 may be adjusted.

Although the display panel 10 is changed from a flat shape into a concave shape in FIGS. 18 and 19, the display panel 10 may be changed from a concave shape into a flat shape.

Referring to FIG. 20, the frame 21 may bend the display panel 10. According to an embodiment, the frame 21 may include the first frame 22 extending in the first direction (for example, the x direction or the −x direction) and the second frame 23 extending in the second direction (for example, the y direction or the −y direction). According to an embodiment, the first frame 22 and the second frame 23 may bend the first edge EG1 and the second edge EG2 of the display panel 10 to have respective curvatures, respectively.

The first frame 22 may extend in the first direction (e.g., the x direction or the −x direction). The first frame 22 may be bent from the first direction (e.g., the x direction or the −x direction) to the third direction (e.g., the z direction or the −z direction). The first frame 22 may be bent under the control of the controller 1700. Accordingly, the first frame 22 may bend the display panel 10 from the first direction (e.g., the x direction or the −x direction) to the third direction (e.g., the z direction or the −z direction). The first frame 22 may bend the first edge EG1 of the display panel 10 to have a curvature.

The second frame 23 may extend in the second direction (e.g., the y direction or the −y direction). The second frame 23 may be bent from the second direction (e.g., the y direction or the −y direction) to the third direction (e.g., the z direction or the −z direction). The second frame 23 may be bent under the control of the controller 1700. Accordingly, the second frame 23 may bend the display panel 10 from the second direction (e.g., the y direction or the −y direction) to the third direction (e.g., the z direction or the −z direction). The second frame 23 may bend the second edge EG2 of the display panel 10 to have a curvature.

The wire 21WR may bend the first frame 22 and/or the second frame 23. For example, when the wire 21WR is contracted or stretched or a length of the wire 21WR is reduced or increased by a motor, the first frame 22 and/or the second frame 23 may be bent.

According to an embodiment, the plurality of supporters 25 may each extend in the first direction (e.g., the x direction or the −x direction).

The plurality of supporters 25 may be bent from the first direction (e.g., the x direction or the −x direction) to the third direction (e.g., the z direction or the −z direction). According to an embodiment, the first frame 22 may bend the plurality of supporters 25 from the first direction (e.g., the x direction or the −x direction) to the third direction (e.g., the z direction or the −z direction). For example, when the first frame 22 is bent from the first direction (e.g., the x direction or the −x direction) to the third direction (e.g., the z direction or the −z direction), the plurality of supporters 25 may also be bent from the first direction (e.g., the x direction or the −x direction) to the third direction (e.g., the z direction or the −z direction). Accordingly, the display panel 10 may be bent from the first direction (e.g., the x direction or the −x direction) to the third direction (e.g., the z direction or the −z direction).

At least one of the plurality of supporters 25 may move in the third direction (e.g., the z direction or the −z direction). For example, the supporter 25 adjacent to the first edge EG1 from among the plurality of supporters 25 may move in the third direction (e.g., the z direction or the −z direction). According to an embodiment, the second frame 23 may move at least one of the plurality of supporters 25 in the third direction (e.g., the z direction or the −z direction). For example, when the second frame 23 is bent from the second direction (e.g., the y direction or the −y direction) to the third direction (e.g., the z direction or the −z direction), at least one of the plurality of supporters 25 may move in the third direction (e.g., the z direction or the −z direction). Accordingly, the display panel 10 may be bent from the second direction (e.g., the y direction or the −y direction) to the third direction (e.g., the z direction or the −z direction).

The connector 27 may be between adjacent supporters 25. When the plurality of supporters 25 are bent, an interval between adjacent supporters 25 may increase, and a strain applied to the display panel 10 may be locally concentrated. In this case, the display panel 10 may be damaged even when it is a stretchable display panel. According to the present embodiment, the connector 27 may be located between adjacent supporters 25 to connect the adjacent supporters 25 to each other. Accordingly, the connector 27 may prevent or reduce an increase in the interval between adjacent supporters 25 and may effectively prevent or reduce damage to the display panel 10.

According to an embodiment, the controller 1700 may include the first driver 1710 and the second driver 1730. The first driver 1710 may control the frame assembly 20. According to an embodiment, the first driver 1710 may control bending of the first frame 22 and/or the second frame 23. According to an embodiment, the first driver 1710 may include a motor. The motor may contract the wire 21WR, or may reduce a length of the wire 21WR by winding the wire 21WR.

According to an embodiment, the first driver 1710 may include a plurality of motors. Each of the plurality of motors may control bending of the first frame 22 and the second frame 23. According to an embodiment, the plurality of motors may control bending of one frame 21. For example, when the plurality of motors control the first frame 22, the plurality of motors may independently adjust bending of opposite ends of the first frame 22. As another example, when the plurality of motors control the second frame 23, the plurality of motors may independently adjust bending of opposite ends of the second frame 23. Accordingly, the display panel 10 may be bent into various shapes.

The second driver 1730 may control the display unit 1100 to rotate about the second direction (e.g., the y direction or the −y direction). According to an embodiment, the second driver 1730 may include a motor. The motor may rotate the display unit 1100 about the second direction (e.g., the y direction or the −y direction). Accordingly, the display panel 10 may rotate about the second direction (e.g., the y direction or the −y direction) due to the controller 1700.

Figure 21A:
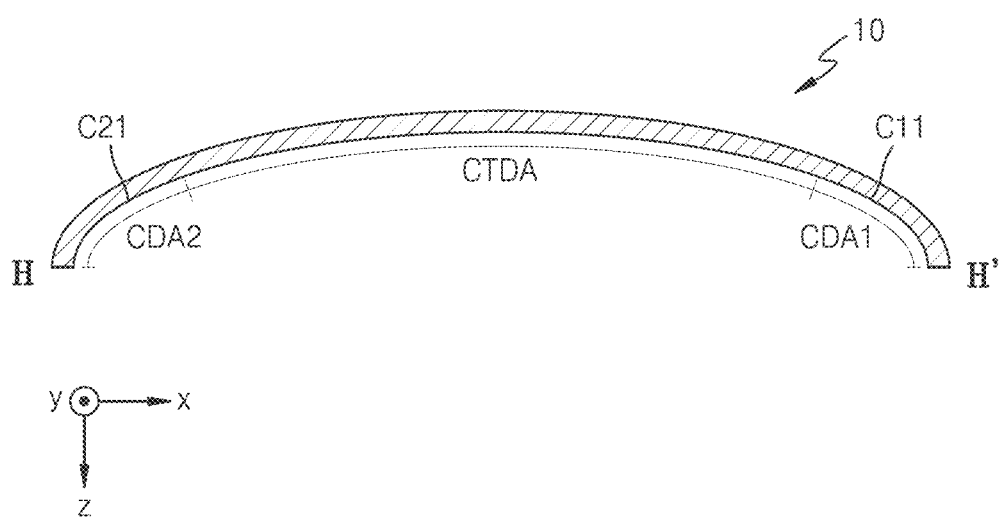
FIG. 21A is a cross-sectional view of a bent display panel of FIG. 19 taken along line H-H' of FIG. 19.
Figure 21B:
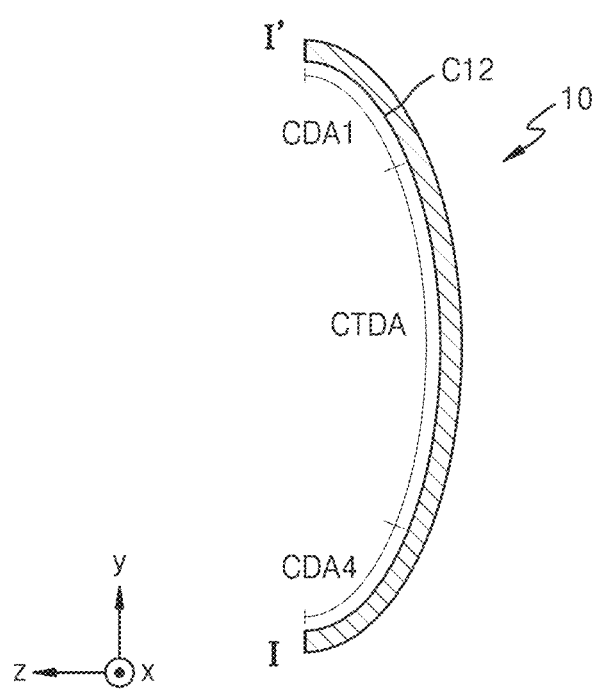
FIG. 21B is a cross-sectional view of the bent display panel of FIG. 19 taken along line I-I' of FIG. 19.
Figure 21C:
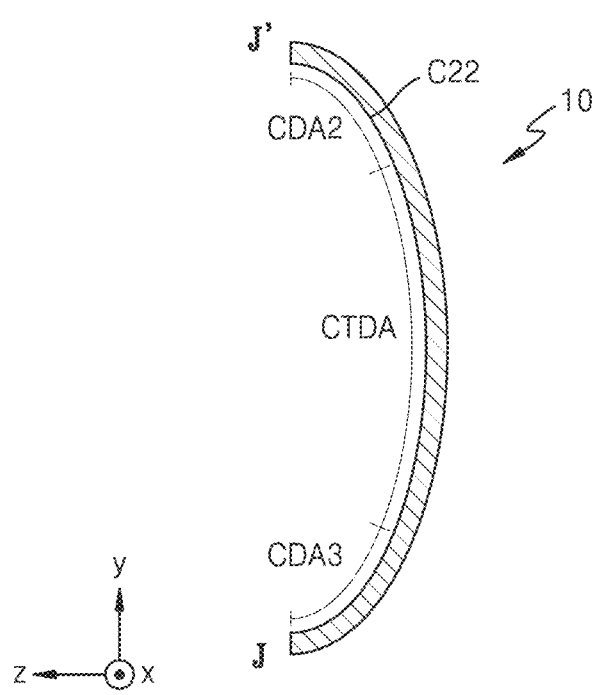
FIG. 21C is a cross-sectional view of the bent display panel of FIG. 19 taken along line J-J' of FIG. 19.

FIG. 21A is a cross-sectional view of the bent display panel 10 of FIG. 19 taken along line H-H' of FIG. 19. FIG. 21B is a cross-sectional view of the bent display panel 10 of FIG. 19 taken along line I-I' of FIG. 19. FIG. 21C is a cross-sectional view of the bent display panel 10 of FIG. 19 taken along line J-J' of FIG. 19. Reference numerals in FIGS. 21A through 21C that are the same as the reference numerals in FIG. 13 denote the same elements, and thus repeated descriptions thereof are omitted.

Referring to FIGS. 21A through 21C, the display panel 10 may include a display area. The display area of the display panel 10, which is bent, may have a concave shape. The display area may include the central display area CTDA and a corner display area. The central display area CTDA may be located at the center of the display panel 10. The corner display area may be located between the central display area CTDA and a corner where edges of the display panel 10 meet each other.

The display panel 10 may include a plurality of corner display areas. For example, the display panel 10 may include the first corner display area CDA1, the second corner display area CDA2, the third corner display area CDA3, and the fourth corner display area CDA4.

The corner display areas may include a first direction curvature and a second direction curvature. The first direction curvature may be defined as a curvature in a cross-section (e.g., an xz cross-section) of the display panel 10 intersecting with the xz plane. The second direction curvature may be defined as a curvature in a cross-section (e.g., an yz cross-section) of the display panel 10 intersecting with the yz plane.

According to an embodiment, the first corner display area CDA1 may include a first direction-first curvature C11 and a second direction-first curvature C12. According to an embodiment, the second corner display area CDA2 may include a first direction-second curvature C21 and a second direction-second curvature C22. According to an embodiment, the third corner display area CDA3 may include a first direction-third curvature and a second direction-third curvature. According to an embodiment, the fourth corner display area CDA4 may include a first direction-fourth curvature and a second direction-fourth curvature.

Accordingly, the bent display panel 10 may be concave when viewed in the cross-section (e.g., the xz cross-section). The bent display panel 10 may be concave when viewed in the cross-section (e.g., the yz cross-section).

According to an embodiment, at least one of the plurality of corner display areas may not have a first direction curvature. According to an embodiment, at least one of the plurality of corner display areas may not have a second direction curvature.

According to an embodiment, a first direction curvature of one of the plurality of corner display areas may be the same as a first direction curvature of another one of the plurality of corner display areas. For example, the first direction-first curvature C11 of the first corner display area CDA1 may be the same as the first direction-second curvature C21 of the second corner display area CDA2. According to another embodiment, a first direction curvature of one of the plurality of corner display areas may be different from a first direction curvature of another one of the plurality of corner display areas. For example, the first direction-first curvature C11 of the first corner display area CDA1 may be different from the first direction-second curvature C21 of the second corner display area CDA2. The first direction-first curvature C11 of the first corner display area CDA1 may be less or greater than the first direction-second direction C21 of the second corner display area CDA2. The controller 1700 may adjust first direction curvatures of the plurality of corner display areas by controlling the first frame 22 of FIG. 20.

According to an embodiment, a second direction curvature of one of the plurality of corner display areas may be the same as a second direction curvature of another one of the plurality of corner display areas. For example, the second direction-first curvature C12 of the first corner display area CDA1 may be the same as the second direction-second curvature C22 of the second corner display area CDA2. According to another embodiment, a first direction curvature of one of the plurality of corner display areas may be different from a first direction curvature of another one of the plurality of corner display areas. For example, the second direction-first curvature C12 of the first corner display area CDA1 may be different from the second direction-second curvature C22 of the second corner display area CDA2. The second direction-first curvature C12 of the first corner display area CDA1 may be less or greater than the second direction-second curvature C22 of the second corner display area CDA2. The controller 1700 may adjust second direction curvatures of the plurality of corner display areas by controlling the second frame 23 of FIG. 20.

The display panel 10 may include a structure and/or material that is stretchable and/or contractible. Accordingly, the display panel 10 may be bent from the first direction (e.g., the x direction or the −x direction) to the third direction (e.g., the z direction or the −z direction), and may be bent from the second direction (e.g., the y direction or the −y direction) to the third direction (e.g., the z direction or the −z direction). The controller 1700 may bend the display panel 10 into various shapes by controlling the first frame 21 and the second frame 23.

Figure 22:
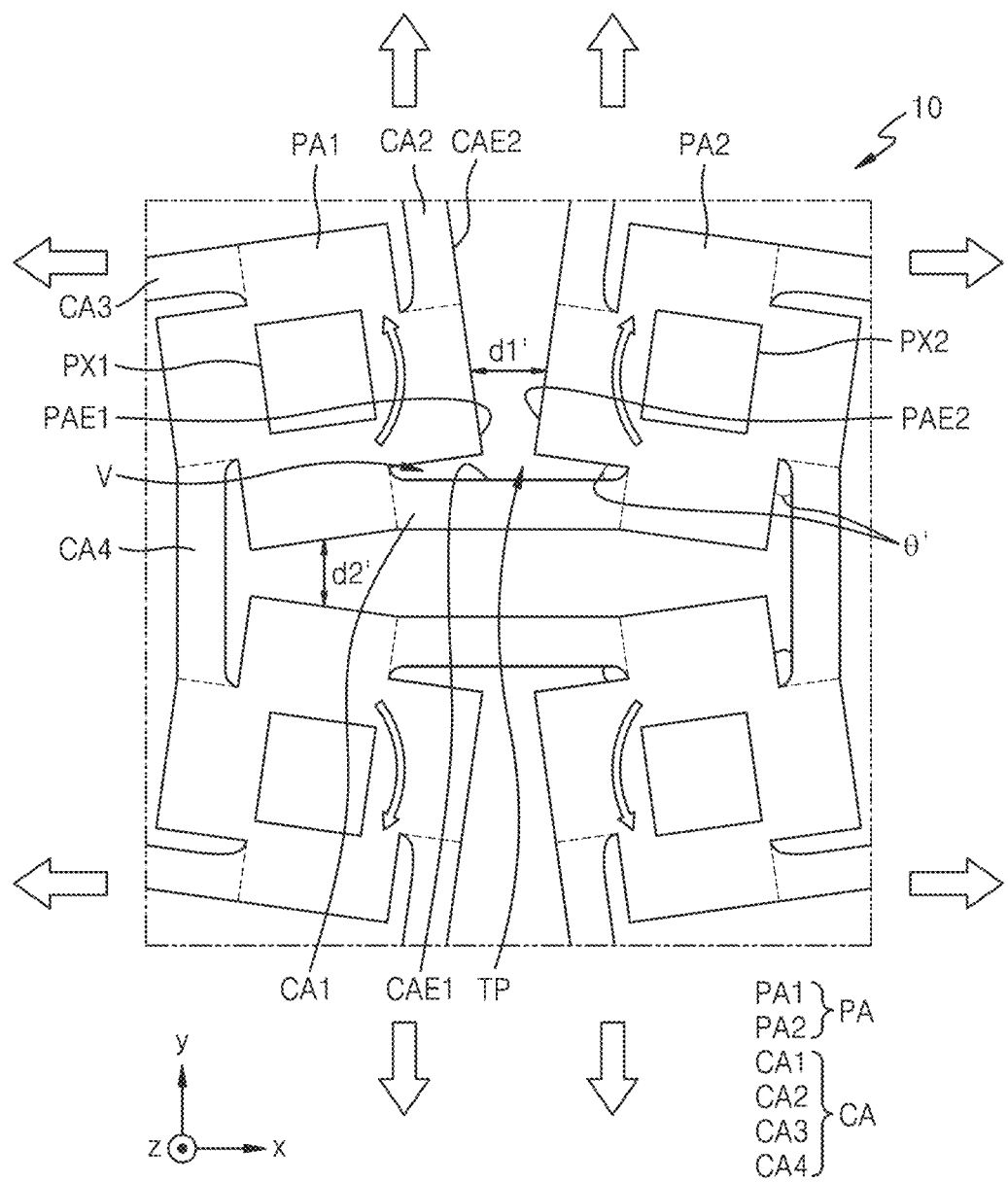
FIG. 22 is an enlarged view of a portion of a display area of a bent display panel, according to an embodiment.

FIG. 22 is an enlarged view of a portion of a display area of the bent display panel 10, according to an embodiment. Reference numerals in FIG. 22 that are the same as the reference numerals in FIG. 16 denote the same elements, and thus repeated descriptions thereof are omitted.

Referring to FIG. 22, the display panel 10 may define the through-portion TP penetrating the display panel 10. A component of the display panel 10 may not be located in the through-portion TP. Accordingly, the display panel 10 may be stretched and/or contracted without damage.

According to an embodiment, a shape of the through-portion TP of the bent display panel 10 may be changed. An angle θ' between the edge CAE1 of the first connection area CA1 and the edge PAE2 of the second pixel area PA2 in the bent display panel 10 may be changed, a size or a shape of a separation area V may be changed, and a position of the pixel area PA may also be changed.

Through such a change in the angle θ', an increase in the area of the separation area V', and/or a change in the shape, each pixel area PA may rotate at a certain angle. Due to the rotation of each pixel area PA, an interval between the pixel areas PA, for example, a first interval d1' and a second interval d2', may vary according to locations.

In the bent display panel 10, stress may be generated in the first direction (e.g., the x direction or the −x direction), the second direction (e.g., the y direction or the −y direction), and/or the third direction (e.g., the z direction or the −z direction). When the display panel 10 defines the through-portion TP, a shape of the through-portion TP of the bent display panel 10 may be changed, and stress in the first direction (e.g., the x direction or the −x direction), the second direction (e.g., the y direction or the −y direction), and/or the third direction (e.g., the z direction or the −z direction) may be reduced. Accordingly, damage to the display panel 10 may be effectively prevented or reduced.

Figure 23A:
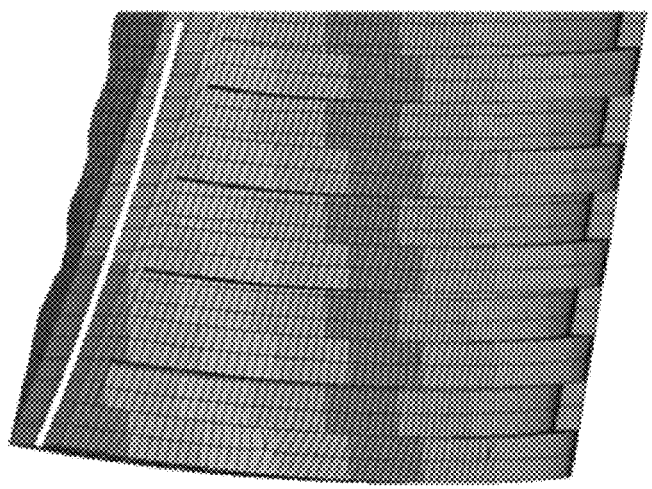
FIG. 23A is an image showing a simulation result when adjacent supporters among a plurality of supporters are connected to each other by a connector, according to an embodiment.
Figure 23B:
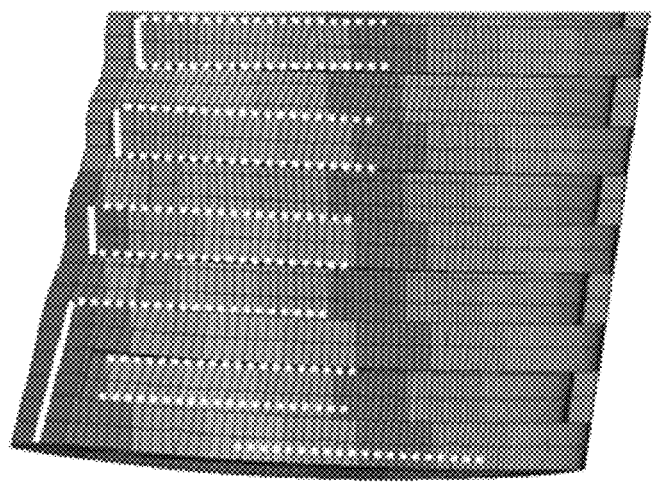
FIG. 23B is an image showing a simulation result when adjacent supporters among a plurality of supporters are not connected to each other by a connector, according to a comparative example.

FIG. 23A is an image showing a simulation result when adjacent supporters among a plurality of supporters are connected to each other by a connector, according to an embodiment. FIG. 23B is an image showing a simulation result when adjacent supporters among a plurality of supporters are not connected to each other by a connector, according to a comparative example.

Referring to FIGS. 23A and 23B, when adjacent supporters are not connected to each other by a connector, a display panel may be discontinuously curved. Accordingly, creases due to intervals between the plurality of supporters in the display panel may be visually recognized. When adjacent supporters are connected to each other by a connector, a display panel may be continuously curved. Creases due to intervals between the plurality of supporters in the display panel may not be visually recognized. Accordingly, when a plurality of supporters are connected to one another by plurality of connectors, a user of a display apparatus may watch a smooth screen image.

Figure 24:
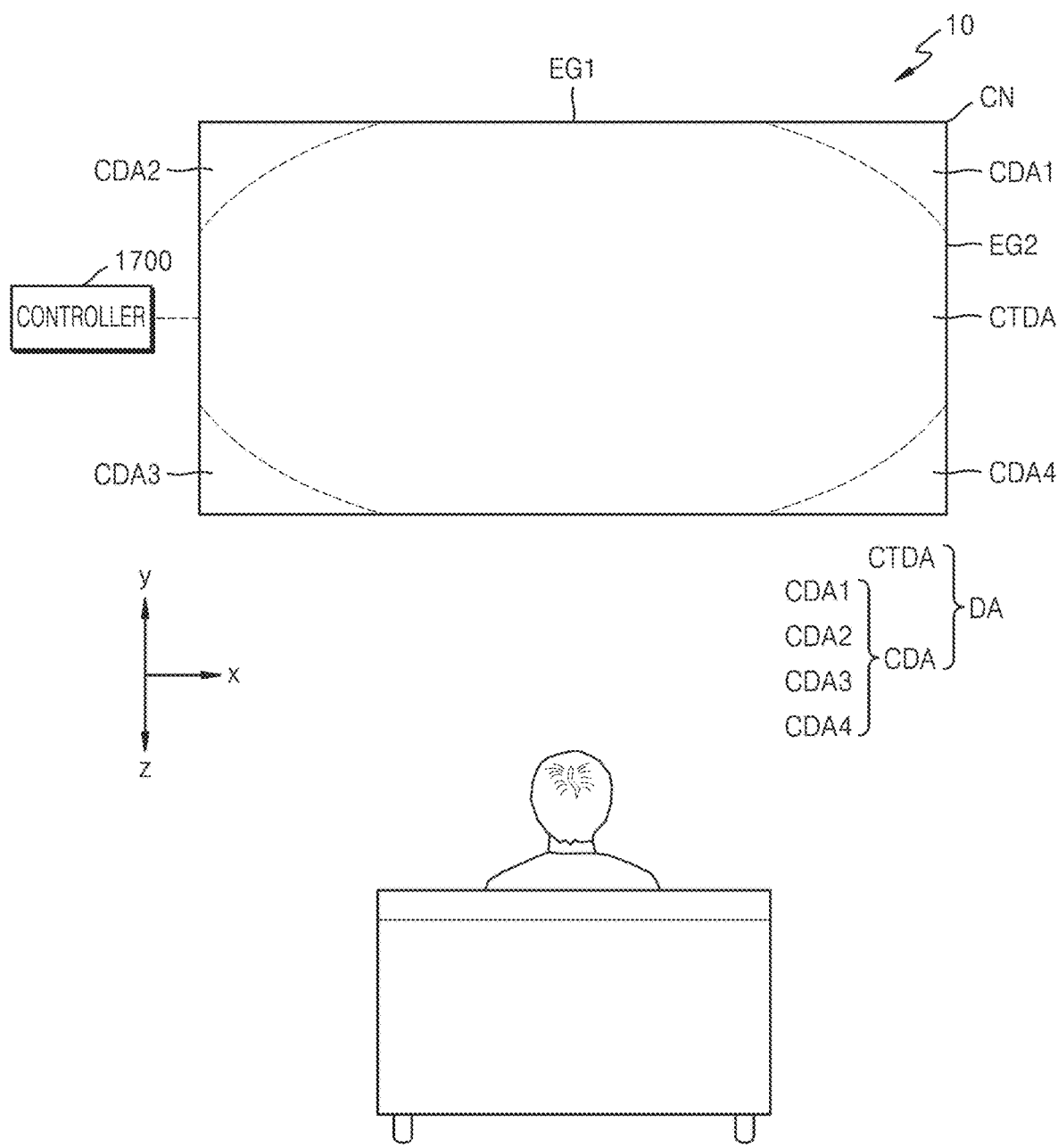
FIGS. 24 through 26 are views illustrating that a display panel is bent by considering a location of a user, according to an embodiment.
Figure 25:
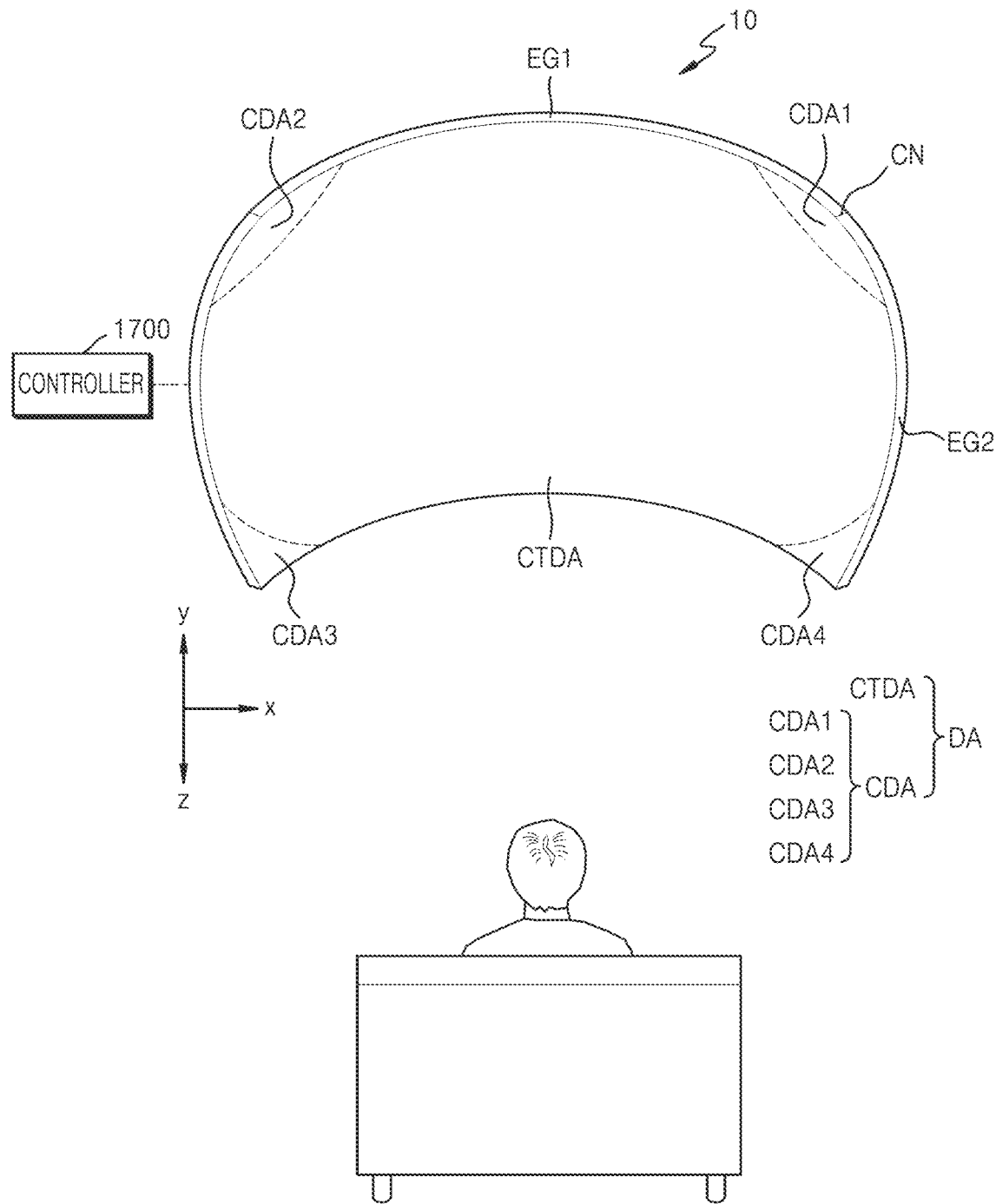
Figure 26:
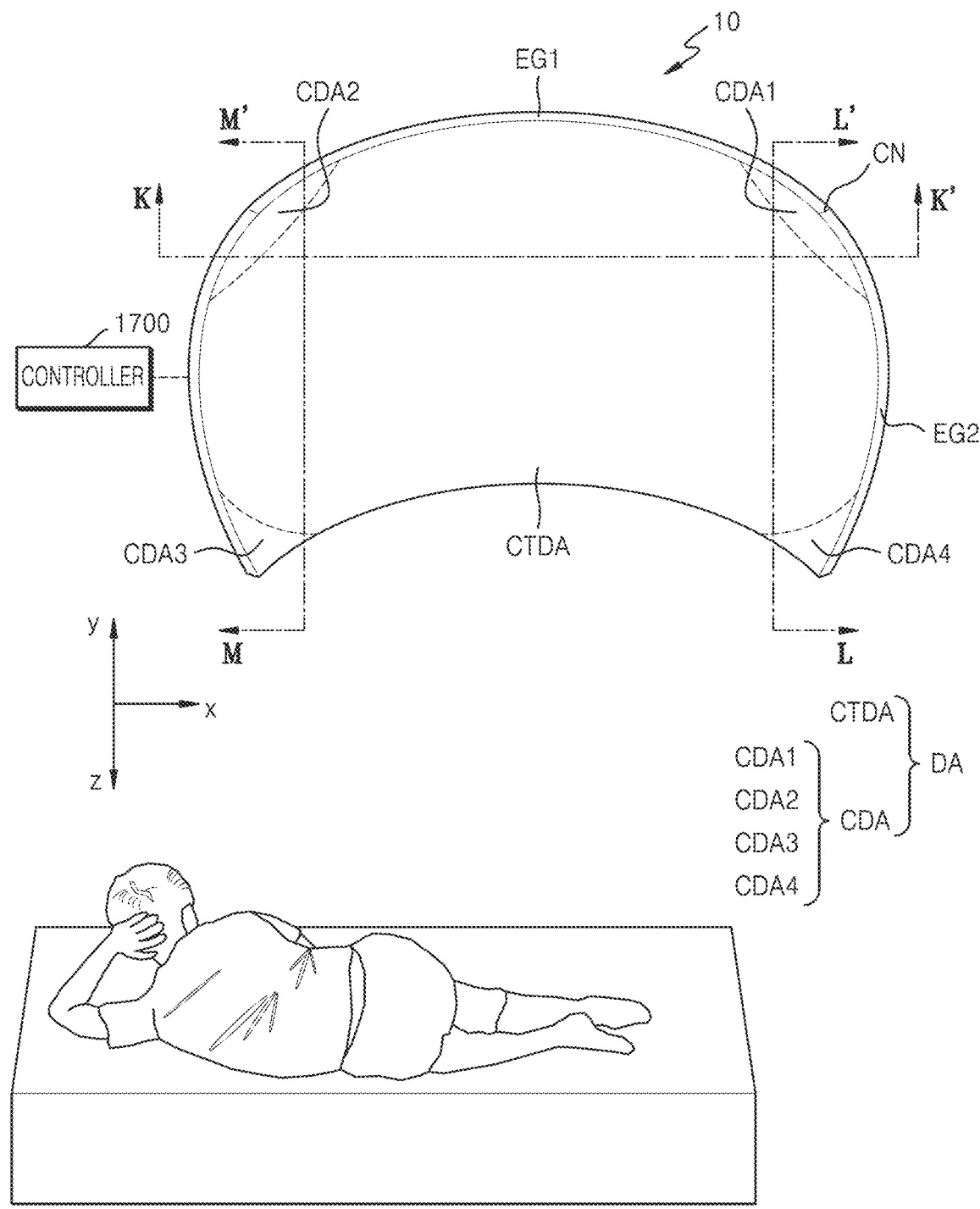
Figure 27A:
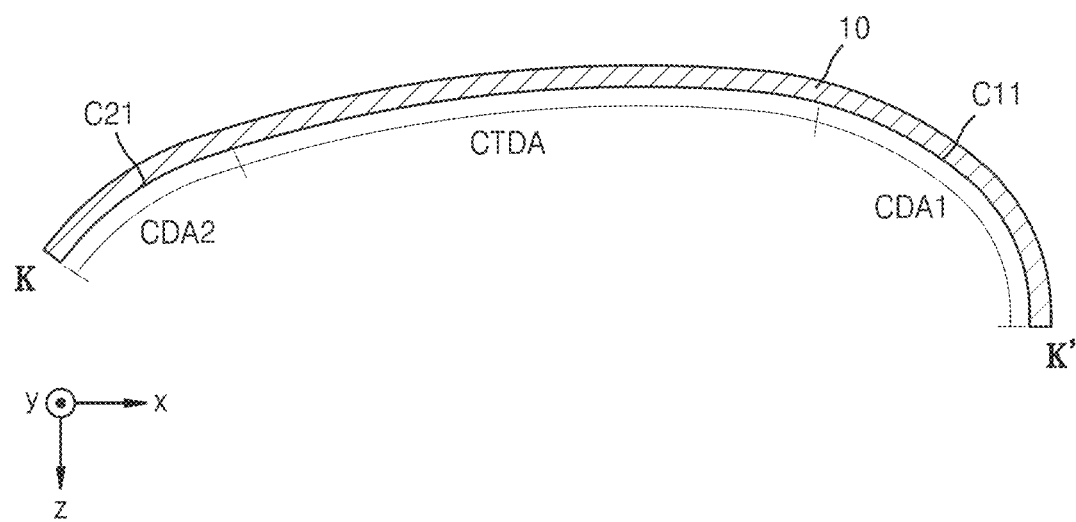
FIG. 27A is a cross-sectional view of the display panel of FIG. 26 taken along line K-K' of FIG. 26.
Figure 27B:
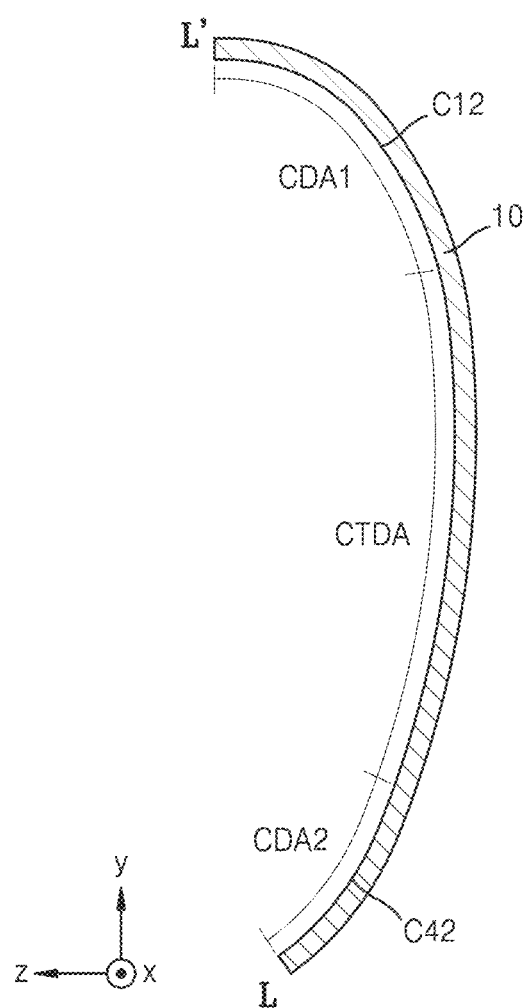
FIG. 27B is a cross-sectional view of the display panel of FIG. 26 taken along line L-L' of FIG. 26.
Figure 27C:
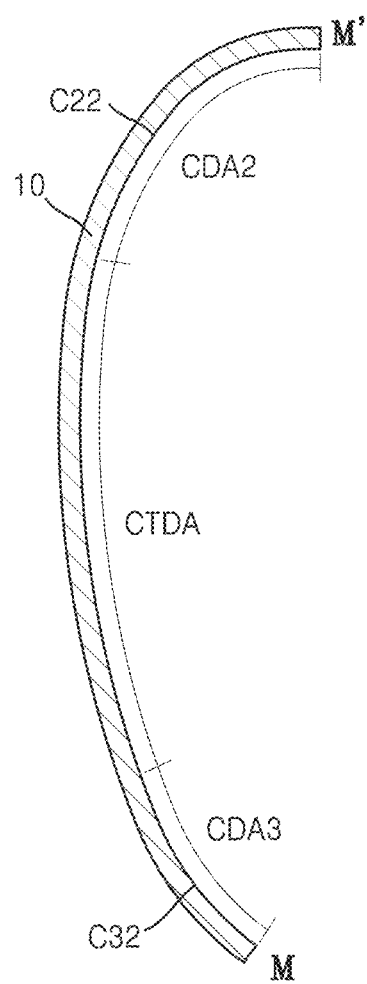
FIG. 27C is a cross-sectional view of the display panel of FIG. 26 taken along line M-M' of FIG. 26.

FIGS. 24 through 26 are views illustrating that the display panel 10 is bent by considering a location of a user, according to an embodiment. FIG. 27A is a cross-sectional view of the display panel 10 of FIG. 26 taken along line K-K' of FIG. 26. FIG. 27B is a cross-sectional view of the display panel 10 of FIG. 26 taken along line L-L' of FIG. 26. FIG. 27C is a cross-sectional view of the display panel 10 of FIG. 26 taken along line M-M' of FIG. 26.

Referring to FIG. 24, an image may be displayed in the display area DA of the display panel 10. The display area DA may include the central display area CTDA and the corner display area CDA. The central display area CTDA may be located at the center of the display panel 10. The corner display area CDA may be located between the central display area CTDA and the corner CN, where edges of the display panel 10 meet each other.

The display panel 10 may include a plurality of corner display areas CDA. For example, the display panel 10 may include the first corner display area CDA1, the second corner display area CDA2, the third corner display area CDA3, and the fourth corner display area CDA4.

The display panel 10 may include edges. According to an embodiment, the display panel 10 may include the first edge EG1 extending in the first direction (for example, the x direction or the −x direction) and the second edge EG2 extending in the second direction (for example, the y direction or the −y direction).

The controller 1700 may obtain information to bend the display panel 10. The information obtained to bend the display panel 10 may be information on a location of at least one user. According to an embodiment, the location of the at least one user may be defined as a location of the at least one user's head with respect to the display panel 10.

According to an embodiment, the location information of the at least one user may be location information of one user. According to another embodiment, the location information of the at least one user may be location information of a plurality of users.

According to an embodiment, the controller 1700 may obtain information on a location of a user by using a position sensor of the display apparatus 1. The position sensor may be, for example, a laser displacement sensor, an ultrasonic displacement sensor, or the like.

Referring to FIGS. 25 and 26, the controller 1700 may bend the display panel 10 so that each of the first edge EG1 and the second edge EG2 has a curvature by considering information on a location of a user. According to an embodiment, the controller 1700 may bend the display panel 10 so that each of the first edge EG1 has a preset curvature and the second edge EG2 has a preset curvature by considering information set by the user. According to an embodiment, the display area DA of the display panel 10, which is bent, may have a concave shape.

Referring to FIGS. 26 and 27A through 27C, the location of the user may be changed. According to an embodiment, the location of the user may be changed in the first direction (e.g., the x direction or the −x direction) and/or the second direction (e.g., the y direction or the −y direction). For example, in FIG. 26, the location of the user is changed in the −x direction and the −y direction.

The controller 1700 may obtain information to bend the display panel 10. The controller 1700 may bend the display panel 10 so that each of the first edge EG1 and the second edge EG2 has a curvature by considering the obtained information.

The corner display areas CDA may include a first direction curvature in a cross-section (e.g., an xz cross-section) of the corner display areas CDA intersecting with the xz plane and a second direction curvature in a cross-section (e.g., an yz cross-section) of the corner display areas CDA intersecting with the yz plane.

According to an embodiment, the first corner display area CDA1 may include the first direction-first curvature C11 and the second direction-first curvature C12. According to an embodiment, the second corner display area CDA2 may include the first direction-second curvature C21 and the second direction-second curvature C22. According to an embodiment, the third corner display area CDA3 may include a first direction-third curvature and a second direction-third curvature. According to an embodiment, the fourth corner display area CDA4 may include a first direction-fourth curvature and a second direction-fourth curvature.

According to an embodiment, a first direction curvature of one of the plurality of corner display areas may be different from a first direction curvature of another one of the plurality of corner display areas. For example, the first direction-first curvature C11 of the first corner display area CDA1 may be different from the first direction-second curvature C21 of the second corner display area CDA2. The first direction-first curvature C11 of the first corner display area CDA1 may be greater than the first direction-second direction C21 of the second corner display area CDA2.

A second direction curvature of one of the plurality of corner display areas may be different from a second direction curvature of another one of the plurality of corner display areas. For example, the second direction-first curvature C12 of the first corner display area CDA1 may be greater than a second curvature C42 of the fourth corner display area CDA4. The second direction-second curvature C22 of the second corner display area CDA2 may be greater than a second curvature C32 of the third corner display area CDA3.

The display panel 10 according to an embodiment may be bent from the first direction (e.g., the x direction or the −x direction) to the third direction (e.g., the z direction or the −z direction), and may be bent from the second direction (e.g., the y direction or the −y direction) to the third direction (e.g., the z direction or the −z direction). Such bending may be possible because the display panel 10 is a stretchable and/or contractible display panel.

Also, the controller 1700 may bend the display panel 10 into various shapes by considering obtained information. Accordingly, various viewing experiences may be provided to a user who watches an image in the display area DA, and a screen distortion felt by the user may be reduced.

According to some embodiments, information obtained to bend the display panel 10 may include not only location information of at least one user who watches an image but also at least one of information corresponding to a manipulation of a remote controller connected to the display panel 10, information corresponding to a voice signal of the at least one user who watches the image, and information on a type of content included in the image. In this case, the controller 1700 may bend the display panel 10 so that each of the first edge EG1 and the second edge EG2 has a curvature by considering the obtained information.

As described above, the display apparatus according to an embodiment may include a connector connecting the adjacent supporters. Accordingly, when a display panel is bent, an increase in an interval between adjacent supporters among a plurality of supporters may be prevented or reduced, and damage to the display panel may be effectively prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a display panel including a first edge extending in a first direction and a second edge extending in a second direction intersecting with the first direction;
a frame extending in one of the first direction and the second direction and located behind the display panel;
a plurality of supporters located between the display panel and the frame, wherein each of the plurality of supporters extends in the first direction; and
a connector connecting adjacent supporters among the plurality of supporters,
wherein the frame comprises a first frame extending in the first direction and a second frame extending in the second direction, and
the first frame and the second frame bend the display panel so that each of the first edge and the second edge has a curvature.

2. The display apparatus of claim 1, wherein the connector is located between the adjacent supporters and comprises a first elastomer.

3. The display apparatus of claim 2, further comprising a cushion layer located between the display panel and the plurality of supporters,
wherein the cushion layer comprises a second elastomer.

4. The display apparatus of claim 3, wherein the first elastomer is identical with the second elastomer.

5. The display apparatus of claim 3, wherein a modulus of the connector is different from a modulus of the cushion layer.

6. The display apparatus of claim 1, further comprising a plurality of balls surrounded by the connector and comprising a third elastomer.

7. The display apparatus of claim 1, wherein the connector connects the adjacent supporters in a bridge shape.

8. The display apparatus of claim 7, wherein the connector and the adjacent supporters are integrally provided with each other.

9. The display apparatus of claim 7, wherein a modulus of the connector is different from a modulus of one of the plurality of supporters.

10. The display apparatus of claim 1, wherein the first frame bends the plurality of supporters, and the second frame moves one of the plurality of supporters in a third direction intersecting with the first direction and the second direction.

11. The display apparatus of claim 1, wherein the display panel comprises a center display area and a corner display area located between the center display area and a corner where the first edge and the second edge meet each other, and in a bent state of the display panel, the corner display area is bent from the first direction to a third direction intersecting with the first direction and the second direction and is bent from the second direction to the third direction.

12. A display apparatus comprising:

a display panel including a first edge extending in a first direction and a second edge extending in a second direction intersecting with the first direction;

a plurality of supporters located behind the display panel, wherein each of the plurality of supporters extends in the first direction;

a connector located between adjacent supporters among the plurality of supporters and comprising a first elastomer; and a cushion layer located between the plurality of supporters and the display panel and comprising a second elastomer.

13. The display apparatus of claim 12, wherein the first elastomer is identical with the second elastomer.

14. The display apparatus of claim 12, further comprising a plurality of balls surrounded by the connector and which comprises a third elastomer.

15. The display apparatus of claim 12, wherein a modulus of the connector is different from a modulus of the cushion layer.

16. A display apparatus comprising:

a display panel including a first edge extending in a first direction and a second edge extending in a second direction intersecting with the first direction;

a frame comprising a first frame located behind the display panel and extending in the first direction and a second frame located behind the display panel and extending in the second direction;

a plurality of supporters located between the display panel and the frame, wherein each of the plurality of supporters extends in the first direction; and a connector connecting adjacent supporters among the plurality of supporters in a bridge shape, wherein the first frame bends the display panel so that the first edge has a curvature, and the second frame bends the display panel so that the second edge has a curvature.

17. The display apparatus of claim 16, wherein the connector and the adjacent supporters are integrally provided with each other.

18. The display apparatus of claim 16, wherein a modulus of the connector is different from a modulus of one of the plurality of supporters.

* * * * *